(12) United States Patent
Sharma et al.

(10) Patent No.: US 12,040,769 B2
(45) Date of Patent: *Jul. 16, 2024

(54) HIGH RESOLUTION ATTENUATOR OR PHASE SHIFTER WITH WEIGHTED BITS

(71) Applicant: pSemi Corporation, San Diego, CA (US)

(72) Inventors: Vikas Sharma, Reading (GB); Peter Bacon, Derry, NH (US)

(73) Assignee: pSemi Corporation, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/082,360

(22) Filed: Dec. 15, 2022

(65) Prior Publication Data

US 2023/0198491 A1 Jun. 22, 2023

Related U.S. Application Data

(63) Continuation of application No. 17/115,368, filed on Dec. 8, 2020, now Pat. No. 11,533,037, which is a
(Continued)

(51) Int. Cl.
*H03H 11/20* (2006.01)
*H03H 7/20* (2006.01)
(Continued)

(52) U.S. Cl.
CPC ............... *H03H 7/25* (2013.01); *H03H 7/20* (2013.01); *H03H 11/20* (2013.01); *H03H 11/245* (2013.01); *H03K 17/687* (2013.01)

(58) Field of Classification Search
CPC .. H03H 7/20; H03H 7/18; H03H 7/24; H03H 7/25; H03H 7/253; H03H 7/255;
(Continued)

(56) References Cited

U.S. PATENT DOCUMENTS

| 5,394,122 A | 2/1995 | Conway et al. |
| 9,742,435 B1 | 8/2017 | Poghosyan et al. |

(Continued)

FOREIGN PATENT DOCUMENTS

| JP | 2009159491 | 7/2009 |
| KR | 20180020999 | 2/2018 |

(Continued)

OTHER PUBLICATIONS

Ahn, Jeong Hwan, Internation Search Report and Written Opinion received from the Korean Intellectual Property Office dated Oct. 15, 2019 for appln. No. PCT/US2019/037810, 12 pgs.
(Continued)

*Primary Examiner* — Stephen E. Jones
(74) *Attorney, Agent, or Firm* — JAQUEZ LAND GREEHAUS & McFARLAND LLP; John Land, Esq.

(57) ABSTRACT

Digital step attenuator (DSA) and digital phase shifter (DPS) multi-stage circuit architectures that provide for high resolution. Embodiments use a dithering approach to weight bit positions to provide a much finer resolution than the lowest-valued individual stage. Bit position weights for stages are determined so as to enable selection of combinations of n bit positions that provide a desired total attenuation or phase shift range while allowing utilization of the large number of states ($2^n$) available to produce fractional intermediate steps of attenuation or phase shift. The fractional intermediate steps have a resolution finer than the lowest-valued stage. Bit position weights may be determined using a weighting function, including weightings determined from a linear series, a geometric series, a harmonic series, or alternating variants of such series. In some embodiments, at least one bit position has a fixed value that is not determined by the bit position weighting function.

20 Claims, 16 Drawing Sheets

Related U.S. Application Data continuation of application No. PCT/US2019/037810, filed on Jun. 18, 2019, which is a continuation of application No. 16/013,844, filed on Jun. 20, 2018, now Pat. No. 10,505,511.

(51) Int. Cl.
  *H03H 7/25* (2006.01)
  *H03H 11/24* (2006.01)
  *H03K 17/687* (2006.01)

(58) Field of Classification Search
  CPC ........ H03H 7/256; H03H 11/20; H03H 11/16; H03H 11/24; H03H 11/245; H03K 17/687
  See application file for complete search history.

(56) References Cited

U.S. PATENT DOCUMENTS

| | | |
|---|---|---|
| 10,505,511 B1 | 12/2019 | Sharma et al. |
| 10,715,123 B1 | 7/2020 | O'Leary |
| 11,533,037 B2 | 12/2022 | Sharma et al. |
| 2009/0278549 A1 | 11/2009 | Ma |
| 2010/0164656 A1 | 7/2010 | Chiu et al. |
| 2013/0043962 A1 | 2/2013 | Granger-Jones |
| 2014/0266518 A1 | 9/2014 | Wang et al. |
| 2015/0137913 A1 | 5/2015 | Costa |
| 2016/0112026 A1 | 4/2016 | Kocer |
| 2016/0118959 A1 | 4/2016 | Atesal et al. |
| 2016/0380623 A1 | 12/2016 | Allison |
| 2017/0160239 A1 | 6/2017 | Chen et al. |
| 2017/0207769 A1 | 7/2017 | Shrivastava |
| 2017/0237412 A1 | 8/2017 | Sharma |
| 2018/0034445 A1 | 2/2018 | Cho et al. |
| 2021/0159870 A1 | 5/2021 | Sharma et al. |

FOREIGN PATENT DOCUMENTS

| | | |
|---|---|---|
| WO | 2019246156 | 12/2019 |
| WO | 2020257212 | 12/2020 |

OTHER PUBLICATIONS

Jones, Stephen E., Notice of Allowance received from the USPTO dated Sep. 25, 2019 for U.S. Appl. No. 16/013,844, 11 pgs.

Semi Corporation, Preliminary Amendment filed in the USPTO dated Sep. 24, 2018 for U.S. Appl. No. 16/013,844, 5 pgs.

Kim, Sung Hoon, International Preliminary Report of Patentability received from the KIPO dated Nov. 13, 2020 for appln. No. PCT/US2019/037810, 8 pgs.

European Patent Office, Communication pursuant to Rules 161(2) and 162 EPC received from the EPO dated Jan. 27, 2021 for appln. No. 19822940.3, 3 pgs.

Skibinski, Tomi Sweet, Office Action received from the USPTO dated Dec. 2, 2019 for U.S. Appl. No. 16/448,930, 28 pgs.

Skibinski, Tomi Sweet, Notice of Allowance and Examiner Initiated Interview Summary received from the USPTO dated May 6, 2020 for U.S. Appl. No. 16/448,930, 10 pgs.

Yang, Heong Rok, International Search Report and Written Opinion received from the KIPO dated Sep. 25, 2020 for appln. No. PCT/US2020/037965, 9 pgs.

Naumann, Olaf, Extended European Search Report received from the EPO dated Feb. 22, 2022 for appln. No. 19822940.3, 11 pgs.

Jones, Stephen E., Office Action received from the USPTO dated Apr. 26, 2022 for U.S. Appl. No. 17/115,368, 13 pgs.

Jones, Stephen E., Notice of Allowance received from the USPTO dated Aug. 19, 2022 for U.S. Appl. No. 17/115,368, 13 pgs.

Korean Patent Office, English translation of Office Action received dated Jan. 2, 2024 for appln. No. 10-2020-7038144, 17 pgs.

*200*

*210*

*400*

*410*

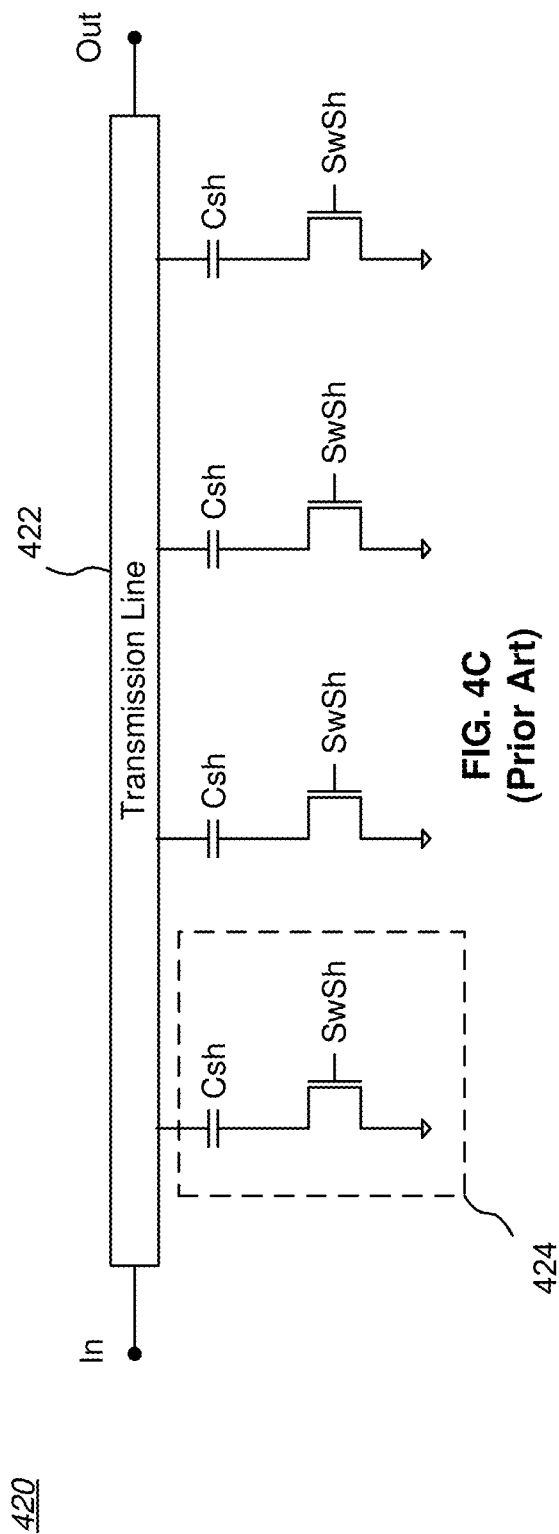

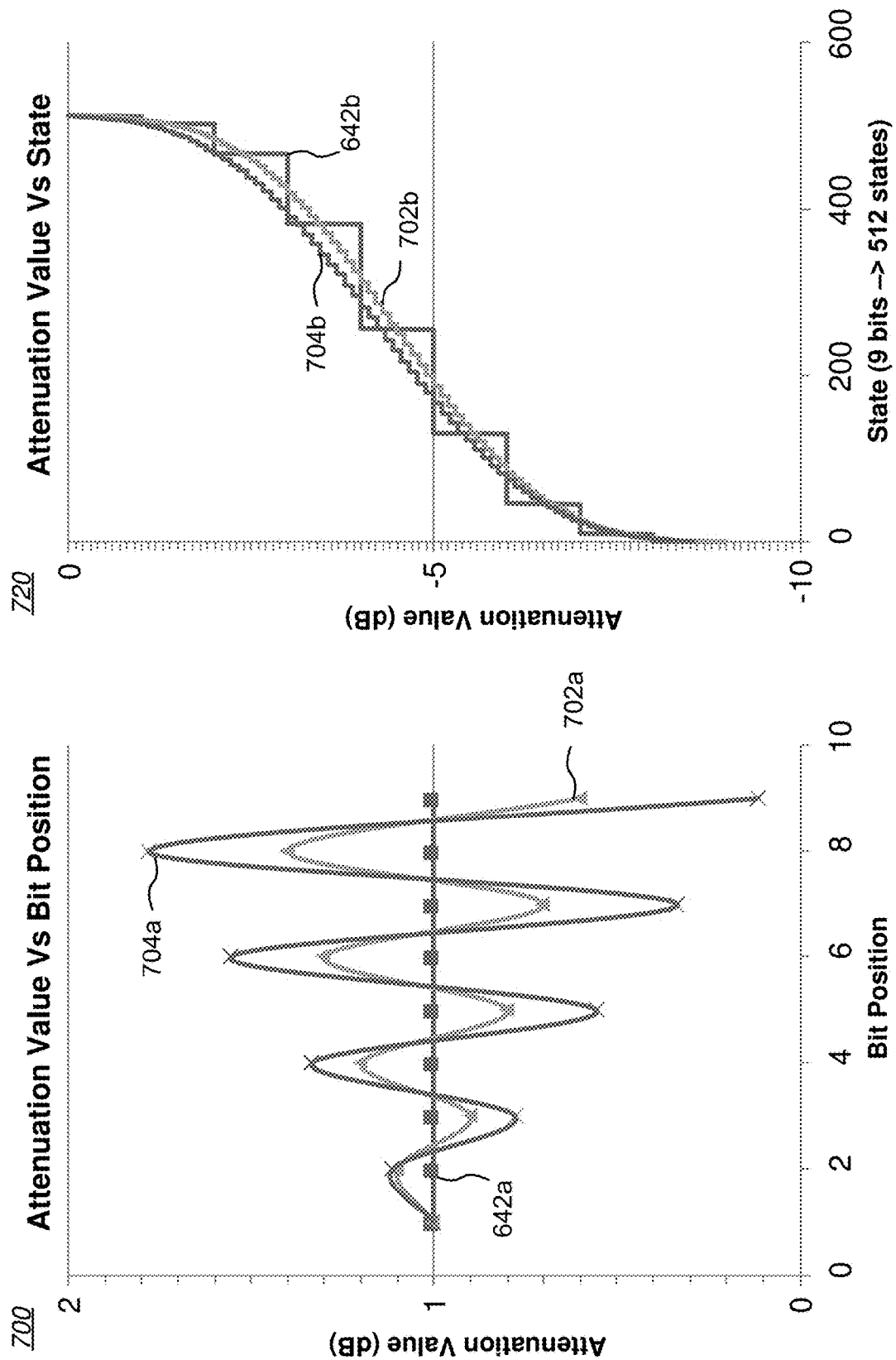

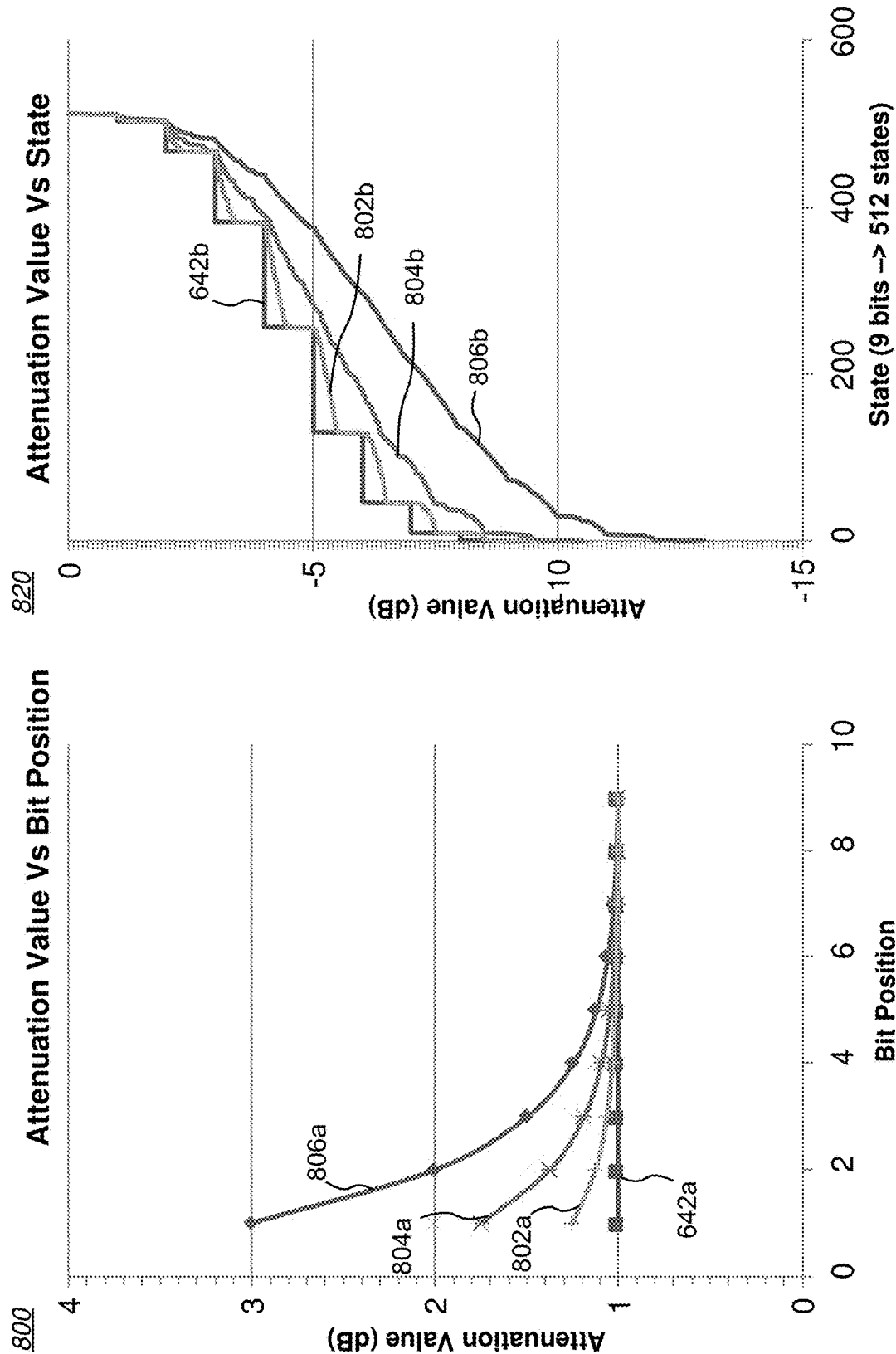

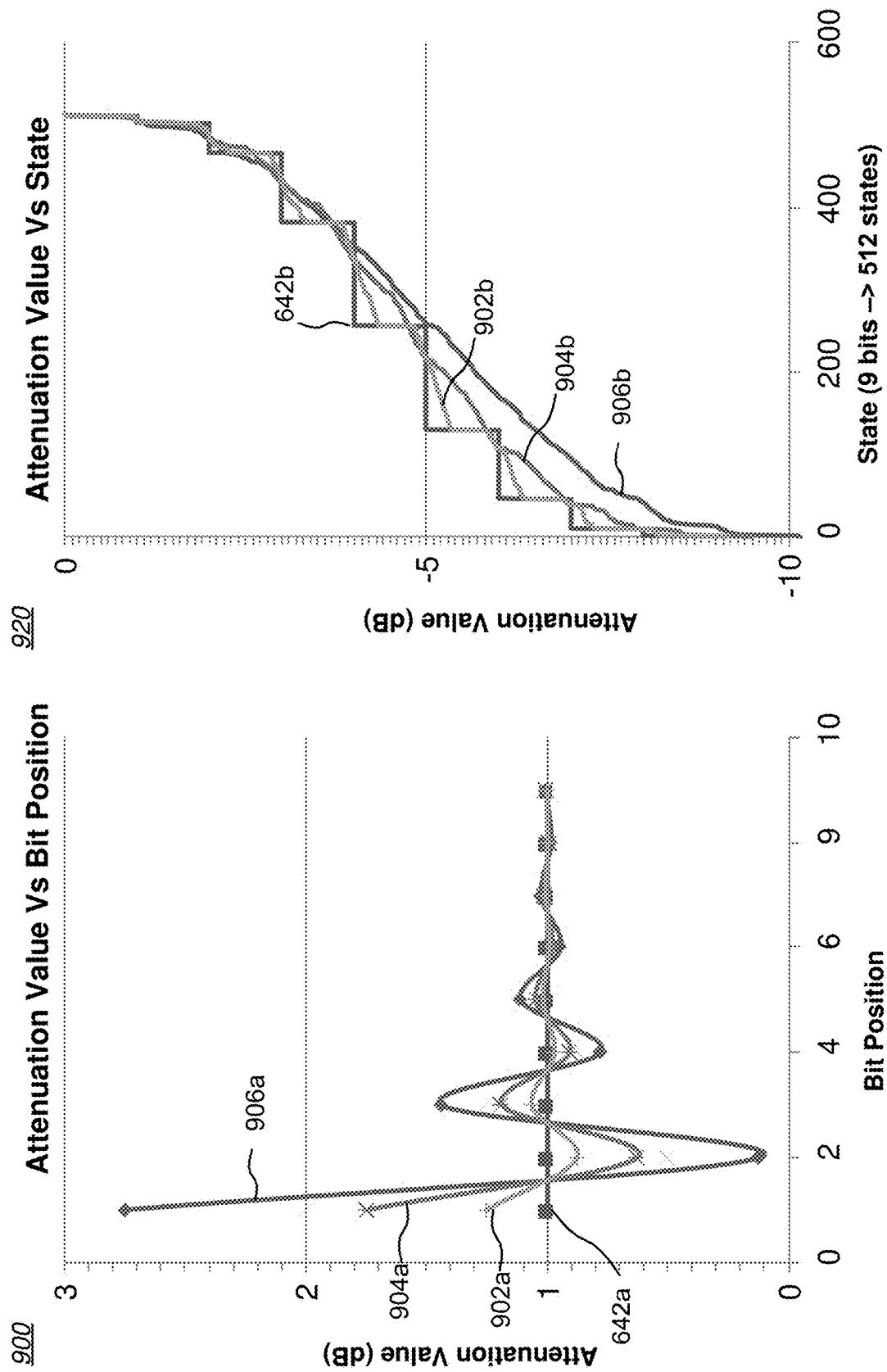

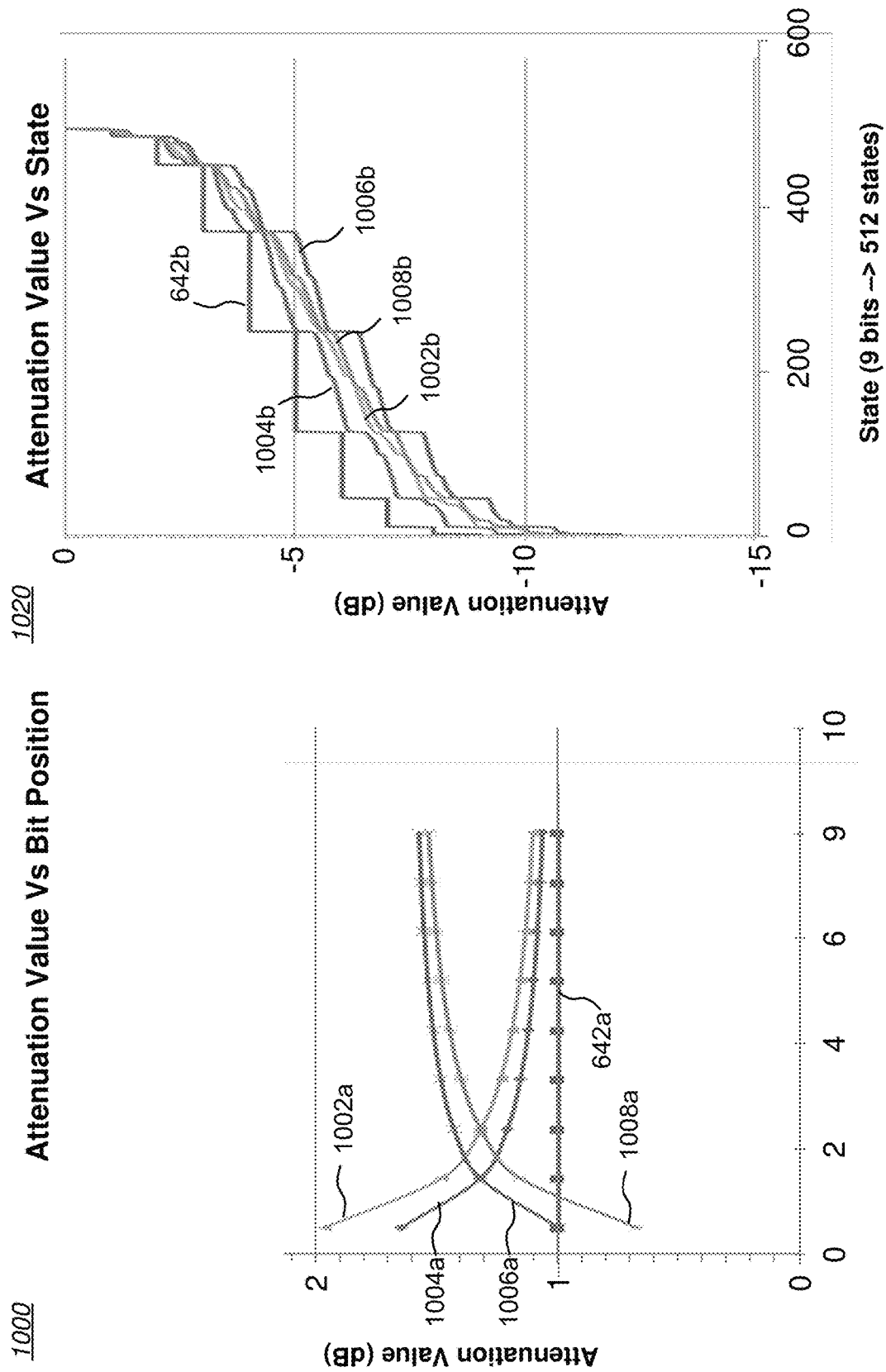

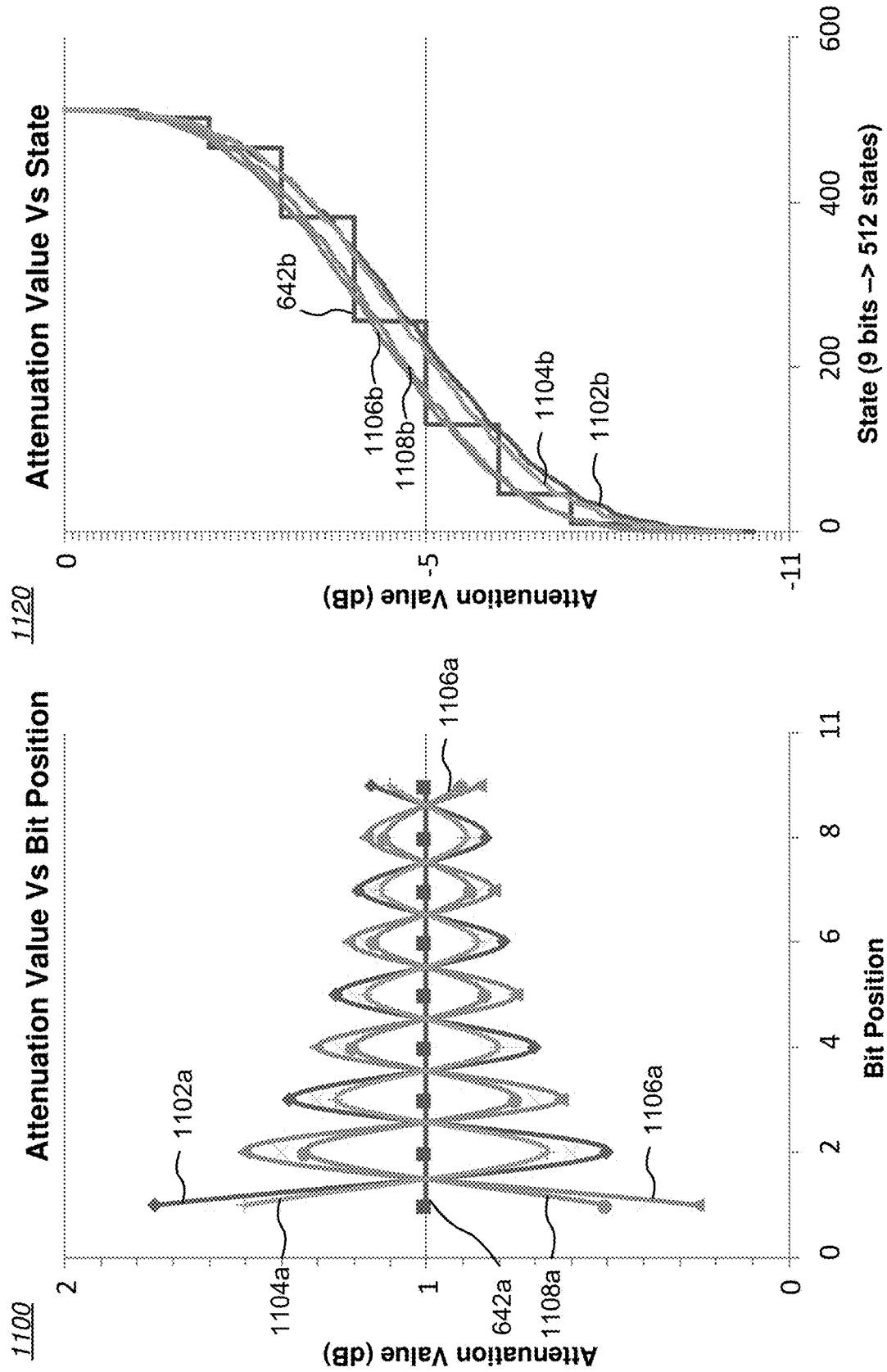

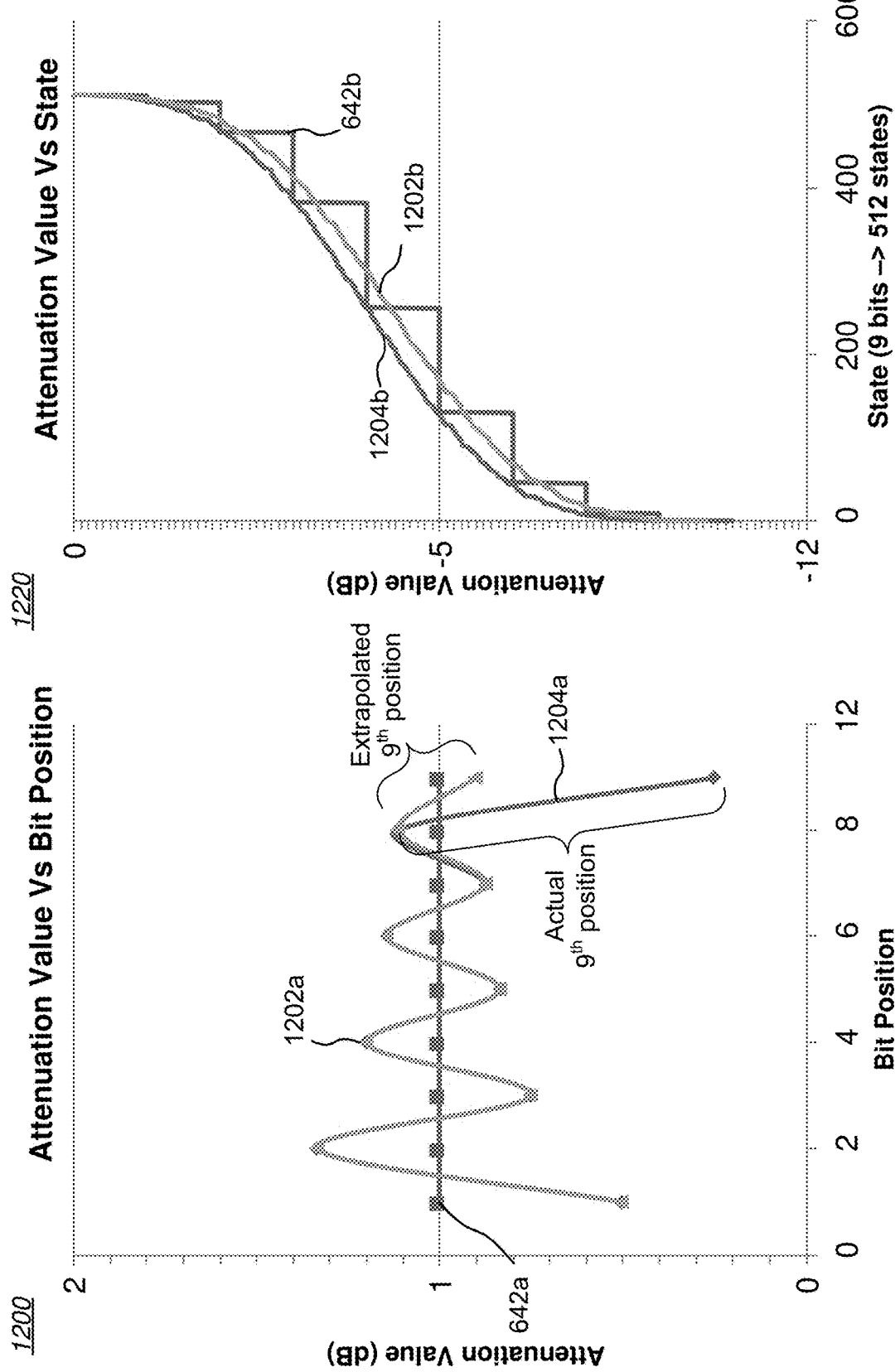

HIGH RESOLUTION ATTENUATOR OR PHASE SHIFTER WITH WEIGHTED BITS

CROSS-REFERENCE TO RELATED APPLICATIONS

The present application is a continuation of U.S. patent application Ser. No. 17/115,368, filed on Dec. 8, 2020, to issue on Dec. 20, 2022 as U.S. Pat. No. 11,533,037, which in turn is a continuation of International Patent Application No. PCT/US2019/037810 filed on Jun. 18, 2019, which in turn is a continuation of U.S. Non-Provisional application Ser. No. 16/013,844, filed on Jun. 20, 2018 for "High Resolution Attenuator or Phase Shifter with Weighted Bits", issuing as U.S. Pat. No. 10,505,511 on Dec. 10, 2019, the disclosures of which are incorporated herein by reference in their entirety.

BACKGROUND

(1) Technical Field

This invention generally relates to electronic circuits, and more specifically to electronic attenuator and/or phase shift circuits.

(2) Background

Digital Step Attenuators

A digital step attenuator (DSA) is an electronic device that reduces the power of a signal in discrete steps without appreciably distorting its waveform. DSA's are frequently used with radio frequency (RF) systems such as transceivers for broadcast radio, cellular telephones, and RF based digital networks (e.g., WiFi, Bluetooth).

Typical DSA's consist of a series cascade of switchable two-state attenuator stages. For example, FIG. 1 is a schematic diagram of a prior art binary-weighted DSA 100. Shown are four series-connected attenuator stages 102a-102d. Under the control of a selector 104 that decodes a supplied control word into individual control lines 106, each attenuator stage 102a-102d may be switched to an active "attenuate" state or to a "bypass" state (also known as a "reference state"). Each attenuator stage 102a-102d may be regarded as having a "bit position" associated with one individual control line 106. In this example, a 4-bit control word applied to the selector 104 can set 16 combinations of attenuation, from no added attenuation (i.e., all stages in a bypass state) to 15 dB of attenuation (i.e., all stages in an attenuation state), with a minimum step size of 1 dB.

The individual attenuator stages 102a-102d may be implemented with a variety of circuits, including bridged-T type, T-type, pi-type, and L-pad type attenuators. For example, FIG. 2A is a schematic diagram of a prior art bridged-T type attenuator 200. When a bypass switch SwB is set to conduct signals and a shunt switch SwSh is set to block signals, a signal applied at an In port is conducted to an Out port, and the bridged-T type attenuator 200 is in a reference state. When the bypass switch SwB is set to block signals and the shunt switch SwSh is set to conduct signals, a signal applied at an In port is attenuated at the Out port due to the interaction of the series Rs and shunt Rsh resistors with each other and with the impedances $Z_0$, in known fashion, and the bridged-T type attenuator 200 is in an attenuation state. The degree of attenuation is determined by the values of the Rs and Rsh resistors.

As another example of an attenuator stage, FIG. 2B is a schematic diagram of a prior art pi-type attenuator 210. As in FIG. 2A, when a bypass switch SwB is set to conduct signals and the paired shunt switches SwSh are set to block signals, a signal applied at an In port is conducted to an Out port, and the pi-type attenuator 210 is in a reference state. When the bypass switch SwB is set to block signals and the shunt switches SwSh are set to conduct signals, a signal applied at the In port is attenuated at the Out port due to the interaction of the series Rs and shunt Rsh resistors, in known fashion, and the pi-type attenuator 210 is in an attenuation state. Again, the degree of attenuation is determined by the values of the Rs and Rsh resistors.

A DSA may also comprise a transmission line with multiple shunt attenuators stages. For example, FIG. 2C is a schematic diagram of a prior art shuntable transmission line digital step attenuator 220. A transmission line 222 (e.g., a microstrip, a co-planar waveguide, or an equivalent structure or circuit) is coupled to one or more shunt attenuator stages 224 each comprising at least a shunt resistor Rsh and a shunt switch SwSh. While the shunt attenuator stages 224 are not literally serially connected to each other in terms of signal conduction, each shunt attenuator stage 224 is connected to a finite section of the transmission line 222, and this combined structure is then serially connected with other like structures to form the entire transmission line 222, thereby enabling an attenuation behavior similar to the serial configuration of FIG. 1. A signal applied at an In port is attenuated at an Out port by switching one or more shunt switches SwSh to a conductive state, thereby shunting a portion of the signal energy to ground and thus attenuating the applied signal. One constraint for transmission line attenuators 220 is that attenuation per stage is generally limited to about one or two dB.

As another example, a DSA can be fabricated using a hybrid coupler and one or more resistive reflective terminating circuits coupled to the direct and coupled ports of the hybrid coupler, in known fashion. Examples of such a DSA are described in U.S. patent application Ser. No. 15/212,046, filed Jul. 15, 2016, entitled "Hybrid Coupler with Phase and Attenuation Control", assigned to the assignee of the present invention and hereby incorporated by reference (a digital phase shifter based on a hybrid coupler is also described).

As should be appreciated, the specific circuitry of the attenuator stages shown in FIGS. 2A-2C may be varied for particular applications. Further, the attenuator stages of a DSA need not be of uniform type. For example, some attenuator stages may be pi-type attenuators while other attenuator stages may be bridged-T type attenuators. Examples of such DSA configurations are described in U.S. patent application Ser. No. 14/996,078, filed Jan. 14, 2016, entitled "Digital Step Attenuator", assigned to the assignee of the present invention and hereby incorporated by reference. Further, some or all stages of a DSA may provide more than one level of attenuation, in which case a corresponding number of bit positions would be assigned to such stages. Examples of multi-state attenuator stages are described in U.S. Pat. No. 9,531,359, issued Dec. 27, 2016, entitled "Improved Multi-State Attenuator", assigned to the assignee of the present invention and hereby incorporated by reference.

Digital Step Phase Shifters

Electronic phase shifter circuits are used to change the transmission phase angle of a signal, and are commonly used to phase shift RF signals. RF phase shifter circuits may be used for applications such as in-phase discriminators, beam forming networks, power dividers, linearization of power amplifiers, and phased array antennas, to name a few.

Digital phase shifter (DPS) circuits are digitally controlled sets of serially-connected multiple phase shifter stages that provide a discrete set of phase states that are selected by control word, directly or after decoding, similar to a DSA 100. For example, FIG. 3 is a schematic diagram of a prior art binary-weighted DPS 300. Shown are four series-connected phase shifter stages 302a-302d. Under the control of a selector 304 that decodes a supplied control word into individual control lines 306, each phase shifter stage 302a-302d may be switched to an active "phase shift" state or to a "bypass" state (also known as a "reference state"). Each phase shifter stage 302a-302d may thus be regarded has having a "bit position" associated with one individual control line 306. In this example, a 4-bit control word applied to the selector 304 can set 16 combinations of phase shift, from no added phase shift (i.e., all stages in a bypass state) to 15° of phase shift (i.e., all stages in a phase shift state), with a minimum step size of 1°.

The individual phase shifters 302a-302d may be implemented with a variety of circuits. For example, FIG. 4A is a schematic diagram of a prior art inductor-based phase shifter 400. When switches Sw1, Sw2 are set to connect to a Bypass path, a signal applied at the In port is conducted to the Out port, and the phase shifter 400 is in a reference state. When switches Sw1, Sw2 are set to connect to an inductor L, a signal applied at the In port is conducted through the inductor L to the Out port, and the phase shifter 400 is in a phase shift state. The degree of phase shift is determined by the value of the inductor L.

As another example, FIG. 4B is a schematic diagram of a prior art capacitor-based phase shifter 410. When switches Sw1, Sw2 are set to connect to a Bypass path, a signal applied at the In port is conducted to the Out port, and the phase shifter 410 is in a reference state. When switches Sw1, Sw2 are set to connect to a capacitor C, a signal applied at the In port is conducted through the capacitor to the Out port, and the phase shifter 400 is in a phase shift state. The degree of phase shift is determined by the value of the capacitor C.

A DPS may also comprise a transmission line with multiple shunt phase shift elements. For example, FIG. 4C is a schematic diagram of a prior art shuntable transmission line phase shifter 420. A transmission line 422 (e.g., a microstrip, a co-planar waveguide, or an equivalent structure or circuit) is coupled to one or more shunt phase shifter stages 424, which in this example each comprise at least a shunt capacitor Csh and a shunt switch SwSh. While the shunt phase shifter stages 424 are not literally serially connected to each other in terms of signal conduction, each shunt phase shifter stage 424 is connected to a finite section of the transmission line 422, and this combined structure is then serially connected with other like structures to form the entire transmission line 422, thereby enabling a phase shifter behavior similar to the serial configuration of FIG. 3. A signal applied at an In port is phase shifted at an Out port by switching one or more shunt switches SwSh to a conductive state, thereby phase shifting the applied signal.

As another example, a DPS can be fabricated using a hybrid coupler and multiple capacitive or inductive reflective terminating circuits coupled to the direct and coupled ports of the hybrid coupler, in known fashion. Examples of such a DPS are described in U.S. patent application Ser. No. 14/988,463, filed Jan. 5, 2016, entitled "Reflection-Based RF Phase Shifter", assigned to the assignee of the present invention and hereby incorporated by reference (a hybrid coupler-based DSA is similar, except that the illustrated capacitive reflective terminating circuits would be replaced with resistive reflective terminating circuits).

As should be appreciated, the specific circuitry of the phase shifter stages shown in FIGS. 4A-4C may be varied for particular applications. Further, the phase shifter stages of a DPS need not be of uniform type. Moreover, some or all stages of a DPS may provide more than one level of phase shift, in which case a corresponding number of bit positions would be assigned to such stages. Examples of multi-state phase shifter stages are described in U.S. patent application Ser. No. 15/017,433, filed Feb. 5, 2016, entitled "Low Loss Multi-State Phase Shifter", assigned to the assignee of the present invention and hereby incorporated by reference.

Bit Position Weighting of Stages

In DSA's and DPS's such as the examples above, it is common to describe each attenuator stage or phase shifter stage as being assigned a bit position corresponding to one of the individual control lines 106, 306 from an associated selector 104, 304. For example, in FIG. 1, attenuator stage 102d may be regarded as associated with the most significant bit (MSB) of a 4-bit binary-weighted control word, while attenuator stage 102a may be regarded as associated with the least significant bit (LSB) of the 4-bit binary-weighted control word. A binary-weighted control word of "1001" would set attenuator stages 102d and 102a to active attenuation states (totaling 9 dB in the illustrated example) while attenuator stages 102b, 102c would be set to bypass (reference) states.

While the above examples of DSA's and DPS's use binary-weighted control words, other bit position weighting schemes commonly used are thermometer weighting (i.e., an incremental or decremental change in attenuation or phase shift value with each unit of change of state) and hybrid thermometer/binary weightings. A further description of such conventional weightings may be found in U.S. Pat. No. 9,397,635, issued Jul. 19, 2016, entitled "Segmented Attenuator with Glitch Reduction", assigned to the assignee of the present invention and hereby incorporated by reference.

A problem of such conventional weightings is that resolution is limited to the LSB value (i.e., smallest attenuator stage value or phase shifter stage value). Thus, for example, the binary weighted DSA 100 of FIG. 1 has a resolution of 1 dB; similarly, the binary weighted DPS 300 of FIG. 3 has a resolution of 1°. As another example, in a transmission line DSA 220 such as is illustrated in FIG. 2C, it is generally desirable to have attenuator stages 224 with similar-valued shunt resistors Rsh repeated along the transmission line 222 at quarter wavelength ($\lambda/4$) intervals. To avoid transmission line loading, thermometer coding would necessarily be used for the similar valued shunt resistors. Accordingly, to get a reasonable maximum range of attenuation, the number of required attenuator stages—and thus of control lines and associated IC area—would be quite large. For example, a transmission line DSA 220 for an application requiring 21 dB of attenuation range with 1 dB of resolution would require 21 shunt attenuator stages 224 at $\lambda/4$ intervals and 21 control lines, thus increasing cost. A similar problem applies to DPS's. Yet for RF applications in particular, it is generally preferable to have higher resolution to improve accuracy.

Accordingly, there is a need for DSA and DPS circuit architectures that provide for high resolution at a relatively low cost. The present invention meets this need and provides additional benefits.

SUMMARY

Embodiments of the invention use a dithering approach to weight bits in order to provide higher resolution in digital step attenuators (DSA's) and digital phase shifters (DPS's), particularly in transmission line DSA's and transmission line DPS's. A number of dithering approaches are disclosed, but each provides for higher resolution—and in many cases, significantly higher resolution—than prior art approaches, without additional cost. Accordingly, embodiments of the present invention provide a means to separate range from resolution to permit greater design flexibility. Such flexibility is leveraged to implement a transmission line architecture and enables embodiments having less than about 2 dB of attenuation per bit position.

More particularly, the bit position weights of stages in a DSA or DPS are determined so as to enable selection of various combinations of N bit positions that provide a desired total attenuation or phase shift range while also allowing utilization of the large number of states ($2^N$) available to produce fractional intermediate steps of attenuation or phase shift that are much finer in resolution than available with prior art thermometer, binary, or hybrid thermometer/binary bit position weightings. In practical terms, embodiments of the present invention can achieve a higher range-to-resolution ratio for a reduced MSB-to-LSB ratio for the same number of bit positions, and exhibit a better Figure of Merit (FOM) metric than conventional designs. Such bit position weights may be determined using a number of methods, but it is convenient to use methods amenable to mathematical expression.

Embodiments include DSA's and DPS's that have stage weights assigned to bit positions determined by applying a bit position weighting function that produces fractional intermediate steps of signal alteration (i.e., attenuation or phase shift). The fractional intermediate steps of signal alteration have a resolution finer than the signal alteration value of a lowest-valued stage. The bit position weighting function may be one of linear series function, an alternating linear series function, a geometric series function, an alternating geometric series function, a harmonic series function, or alternating harmonic series function. Further, the signal alteration value of at least one stage may be set to a fixed value that is not determined by the bit position weighting function.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4C is a schematic diagram of a prior art shuntable transmission line phase shifter.

FIG. 7A is a graph of attenuation weights by bit position for a 9-bit DSA using an alternating linear series bit position weighting, for different values of A0 and K.

FIG. 7B is a graph showing the possible attenuation levels that can be set as a function of various combinations of bit position states for the bit position weightings shown in FIG. 7A.

FIG. 8A is a graph of attenuation weights by bit position for a 9-bit DSA using a geometric series bit position weighting, for different values of A0 and K.

FIG. 8B is a graph showing the possible attenuation levels that can be set as a function of various combinations of bit position states for the bit position weightings shown in FIG. 8A.

FIG. 9A is a graph of attenuation weights by bit position for a 9-bit DSA using an alternating geometric series bit position weighting, for different values of A0 and K.

FIG. 9B is a graph showing the possible attenuation levels that can be set as a function of various combinations of bit position states for the bit position weightings shown in FIG. 9A.

FIG. 10A is a graph of attenuation weights by bit position for a 9-bit DSA using a harmonic series bit position weighting, for different values of A0 and K.

FIG. 10B is a graph showing the possible attenuation levels that can be set as a function of various combinations of bit position states for the bit position weightings shown in FIG. 10A.

FIG. 11A is a graph of attenuation weights by bit position for a 9-bit DSA using an alternating harmonic series bit position weighting, for different values of A0 and K.

FIG. 11B is a graph showing the possible attenuation levels that can be set as a function of various combinations of bit position states for the bit position weightings shown in FIG. 11A.

FIG. 12A is a graph of attenuation weights by bit position for a 9-bit DSA using an alternating harmonic series bit position weighting for bit positions 1 through 8 for selected values of A0 and K, with bit position 9 being assigned a fixed value (0.25 dB in this example).

FIG. 12B is a graph showing the possible attenuation levels that can be set as a function of various combinations of bit position states for the bit position weightings shown in FIG. 12A.

Like reference numbers and designations in the various drawings indicate like elements.

DETAILED DESCRIPTION

The present invention encompasses DSA and DPS circuit architectures that provide for high resolution at a relatively low cost, as well as additional benefits. In general, embodiments of the present invention use a dithering approach to weight bits in order to provide a higher resolution in digital step attenuators (DSA's) and digital phase shifters (DPS's), particularly in transmission line DSA's and transmission line DPS's. An important aspect of such embodiments is that they achieve much finer resolution than the lowest-valued individual attenuation stage or phase shifter stage.

Uniform Bit Position Weighting

To better understand aspects of the invention, it is useful to consider conventional uniform (thermometer) weighting. For purposes of explanation, a DSA example will be used, but the concept applies to both DSA's and DPS's.

Figure 5B:
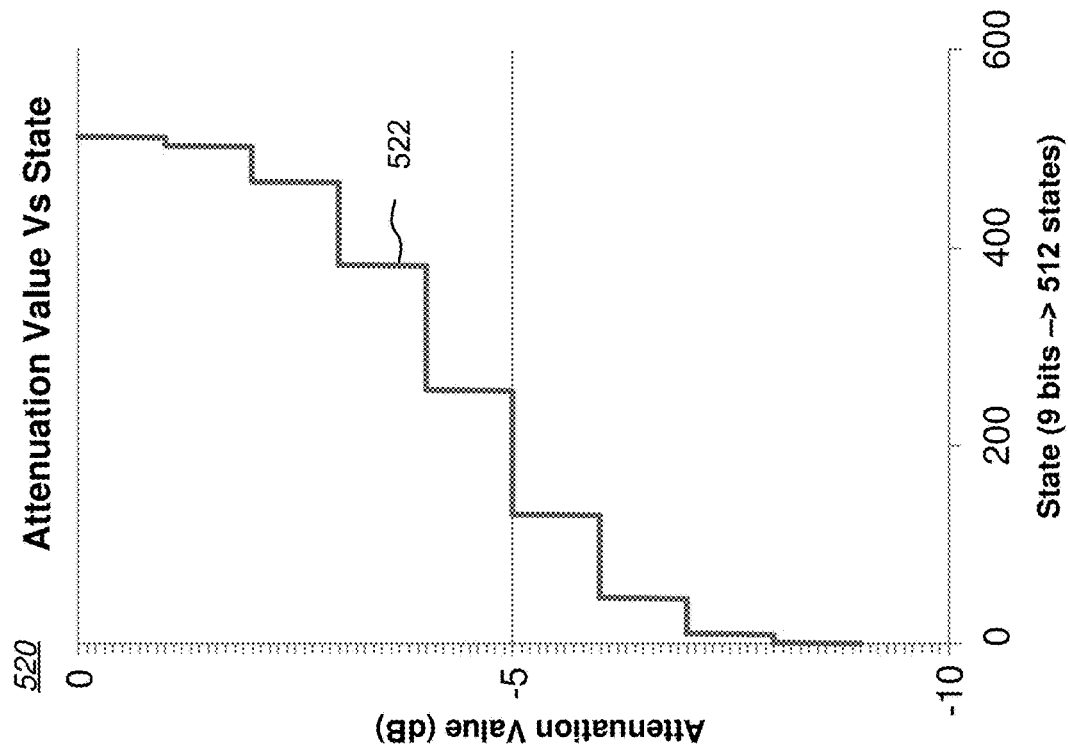
FIG. 5B is a graph showing the possible attenuation levels that can be set as a function of various combinations of bit position states for the bit position weighting shown in FIG. 5A.
Figure 5A:
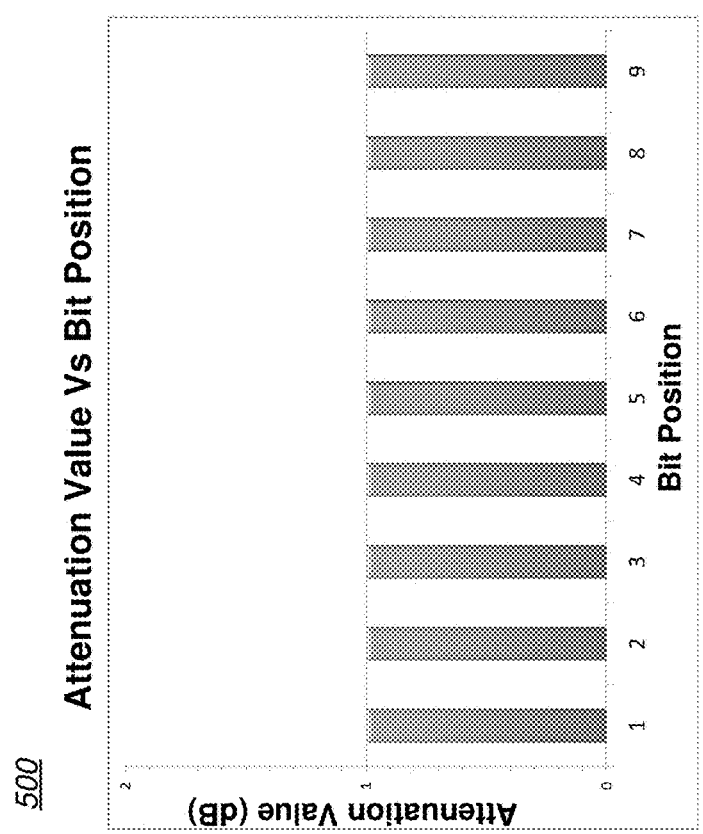
FIG. 5A is a graph of attenuation weights by bit position for a 9-bit DSA using a uniform bit position weighting.

FIG. 5A is a graph 500 of attenuation weights by bit position for a 9-bit DSA using a uniform bit position weighting. Uniform bit position weighting would be commonly used with transmission line DSA's. In the illustrated example, each of the nine bit positions has an attenuation value of 1 dB when switched to the attenuation state (i.e., each bit position can attenuate an input signal by $-1$ dB). Expressed mathematically, the $n^{th}$ bit value=A0, where A0 is a constant ($-1$ dB in this example) and n=bit position $\geq 1$.

In normal usage, higher levels of attenuation would be achieved by incrementally activating additional attenuator stages, until a maximum attenuation level of $-9$ dB is reached. However, because the attenuator stages can be individually switched between a non-attenuating reference state and an active attenuation state, there are actually 512 ($2^9$) possible combinations of control states, although the large number of states provides only 9 levels of possible attenuation. For example, only activating bit positions 1 and 9 achieves the same attenuation level as only activating bit positions 2 and 8.

FIG. 5B is a graph 520 showing the possible attenuation levels that can be set as a function of various combinations of bit position states for the bit position weighting shown in FIG. 5A. As graph curve 522 demonstrates, the attenuation level from 0 dB to $-9$ dB is a coarse step function, since the minimum resolution available between distinct attenuation levels is 1 dB.

A binary bit position weighting would also exhibit a minimum resolution of 1 dB (although the range of attenuation would be larger if 9 stages are used; however, to cover 9 levels of attenuation, only 4 binary weighted stages would be needed). In order to point out the limitation of binary bit position weighting, it may be helpful to consider the mathematical definitions of least significant bit (LSB) and most significant bit (MSB) in the context of attenuators:

$$\text{LSB} = \text{Total\_Attenuation\_Range}/(2^N - 1), \text{ where } N \text{ is the number of bits.} \quad [\text{Eq. 1}]$$

Thus, the LSB can be made quite small by increasing the number of bits N. However, $$\text{MSB} = \text{LSB} * 2^{(N-1)} = \text{Total\_Attenuation\_Range} * 2^{(N-1)} / (2^N - 1) \quad [\text{Eq. 2}]$$

If we assume $2^N$ is much greater than 1, then the denominator in Eq. 2 simplifies to $2^N$ and the MSB approaches (Total_Attenuation_Range/2) for binary bit position weighting (note also that the MSB value quickly runs into a per-bit maximum attenuation limit imposed by practical constraints on a transmission line DSA architecture, typically a maximum of about 2 dB per bit, as noted above).

TABLE 1 shows the MSB issue with binary bit position weighting for several particular embodiments of attenuators varying in the number of bit positions. As the number of bits N increases, the MSB approaches an approximately constant value around 4.5 dB (but that value would be further constrained by the practical constraints on a transmission line DSA architecture noted above).

TABLE 1

| Range (dB) | N-bits | LSB (dB) | MSB (dB) |
|---|---|---|---|
| 9 | 9 | 0.018 | 4.51 |
| 9 | 8 | 0.035 | 4.52 |
| 9 | 7 | 0.071 | 4.54 |
| 9 | 6 | 0.140 | 4.57 |
| 9 | 5 | 0.290 | 4.65 |
| 9 | 4 | 0.600 | 4.80 |
| 9 | 3 | 1.300 | 5.14 |

Dithering of Bit Position Weights

Figure 1:
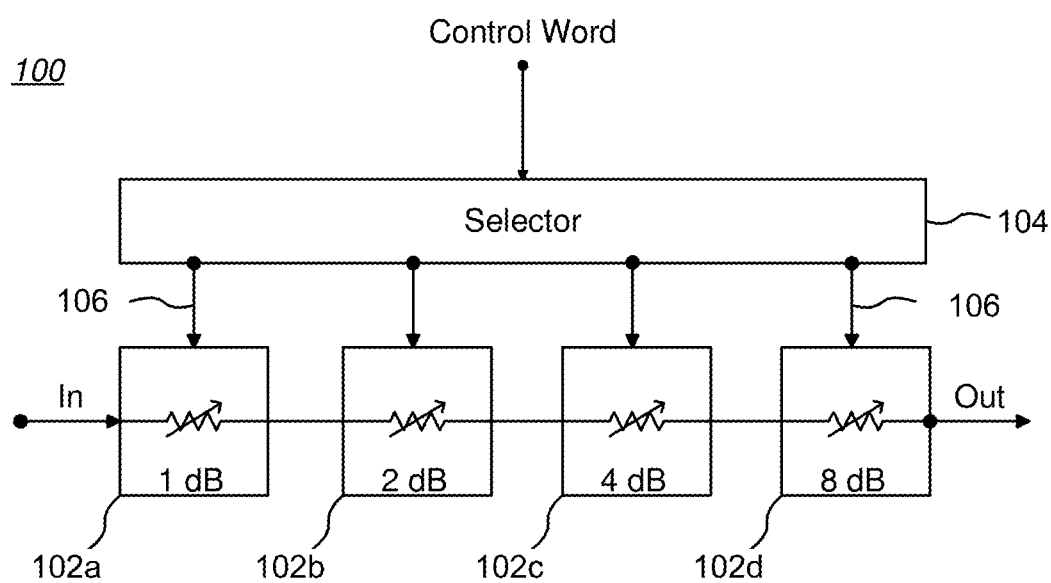
FIG. 1 is a schematic diagram of a prior art binary-weighted DSA.
Figure 2A:
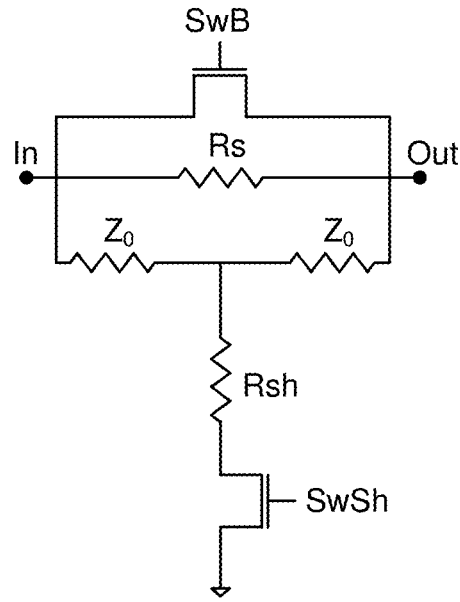
FIG. 2A is a schematic diagram of a prior art bridged-T type attenuator.
Figure 2B:
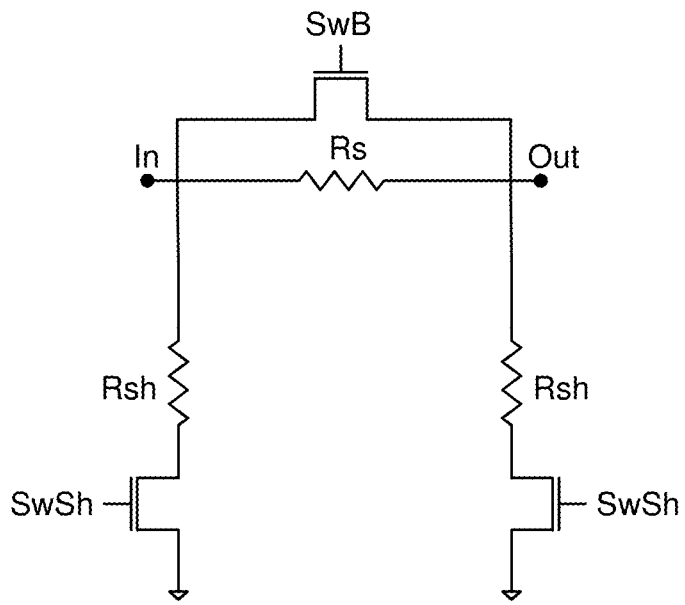
FIG. 2B is a schematic diagram of a prior art pi-type attenuator.
Figure 2C:
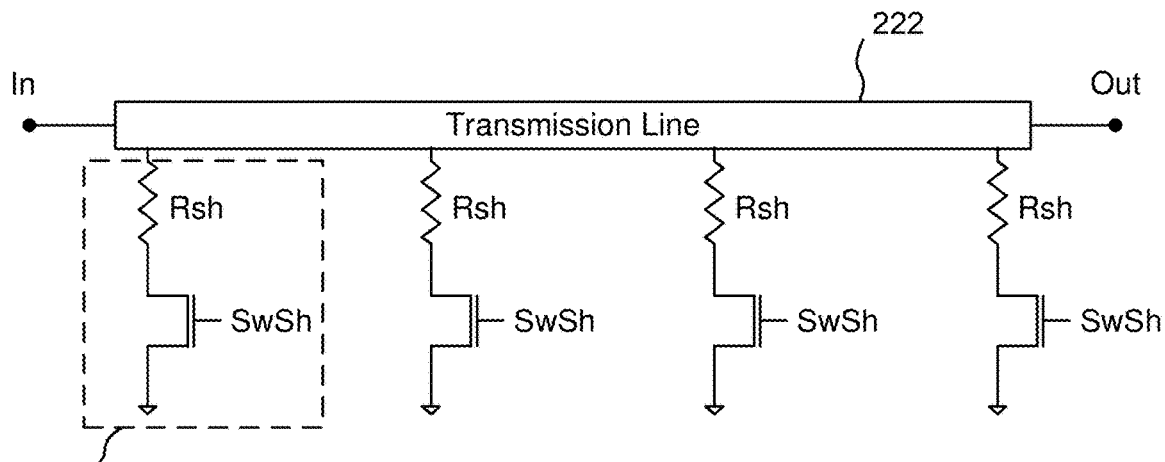
FIG. 2C is a schematic diagram of a prior art shuntable transmission line digital step attenuator.
Figure 3:
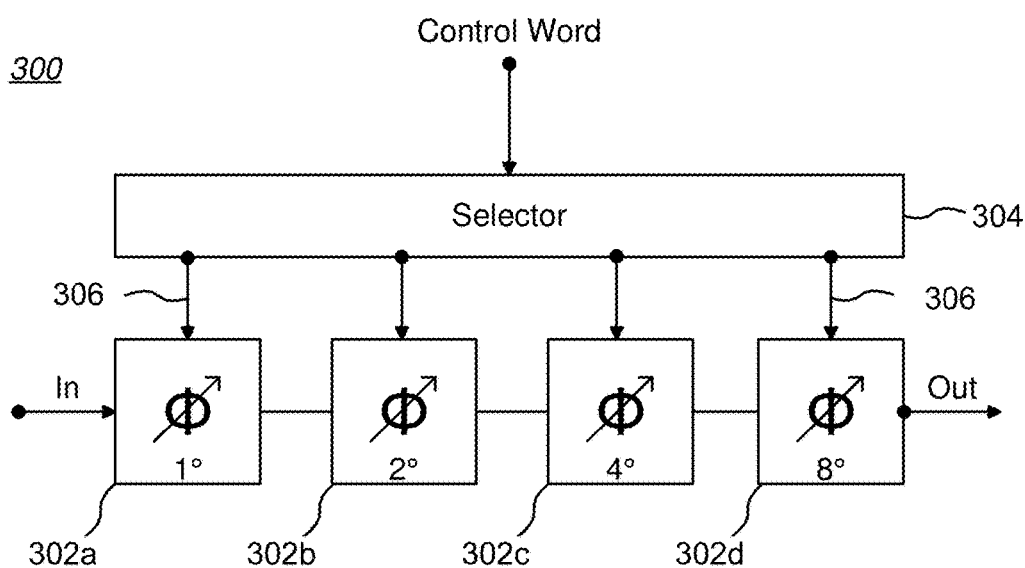
FIG. 3 is a schematic diagram of a prior art binary-weighted DPS.
Figure 4A:
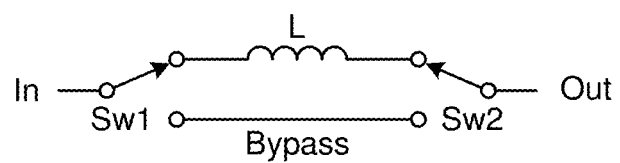
FIG. 4A is a schematic diagram of a prior art inductor-based phase shifter.
Figure 4B:
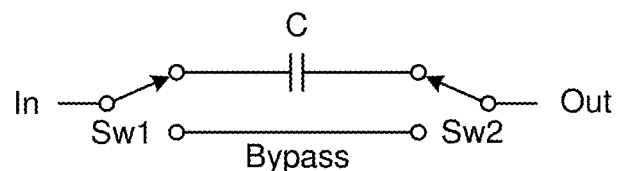
FIG. 4B is a schematic diagram of a prior art capacitor-based phase shifter.

Embodiments of the invention use a dithering approach to weight bits in order to provide higher resolution in DSA's and DPS's, particularly in transmission line DSA's and transmission line DPS's. A number of dithering approaches are disclosed below, but each provides for higher resolution—and in many cases, significantly higher resolution—than prior art approaches, without additional cost. The dithering approaches may be used in conjunction with DSA and DPS circuits similar to the type shown in FIGS. 1, 2C, 3, and/or 4C, but with the novel bit weightings described below.

More particularly, the bit position weights of stages in a DSA or DPS are determined so as to enable selection of various combinations of N bit positions that provide a desired total attenuation or phase shift range while also allowing utilization of the large number of states ($2^N$) available to produce fractional intermediate steps of attenuation or phase shift that are much finer in resolution than available with prior art thermometer, binary, or hybrid thermometer/binary bit position weightings. In practical terms, embodiments of the present invention can achieve a higher range-to-resolution ratio for a reduced MSB-to-LSB ratio for the same number of bit positions, and exhibit a better Figure of Merit (FOM) metric than conventional designs. Such bit position weights may be determined using a number of methods that apply a bit position weighting function that produces fractional intermediate steps of signal alteration (i.e., attenuation or phase shift), but it is convenient to use methods amenable to mathematical expression, several of which are described below.

Linear series bit position weighting: In a first embodiment, the weights assigned to bit positions in a DSA or a DPS are determined by applying a linear series bit position weighting. Expressed mathematically, the $n^{th}$ bit value=A0+((n−1)×K), where A0 is a constant, n=bit position $\geq 1$, and K is a non-zero proportionality constant. An alternative form that provides somewhat different results is: $n^{th}$ bit value=A0−((n−1)×K).

Figure 6B:
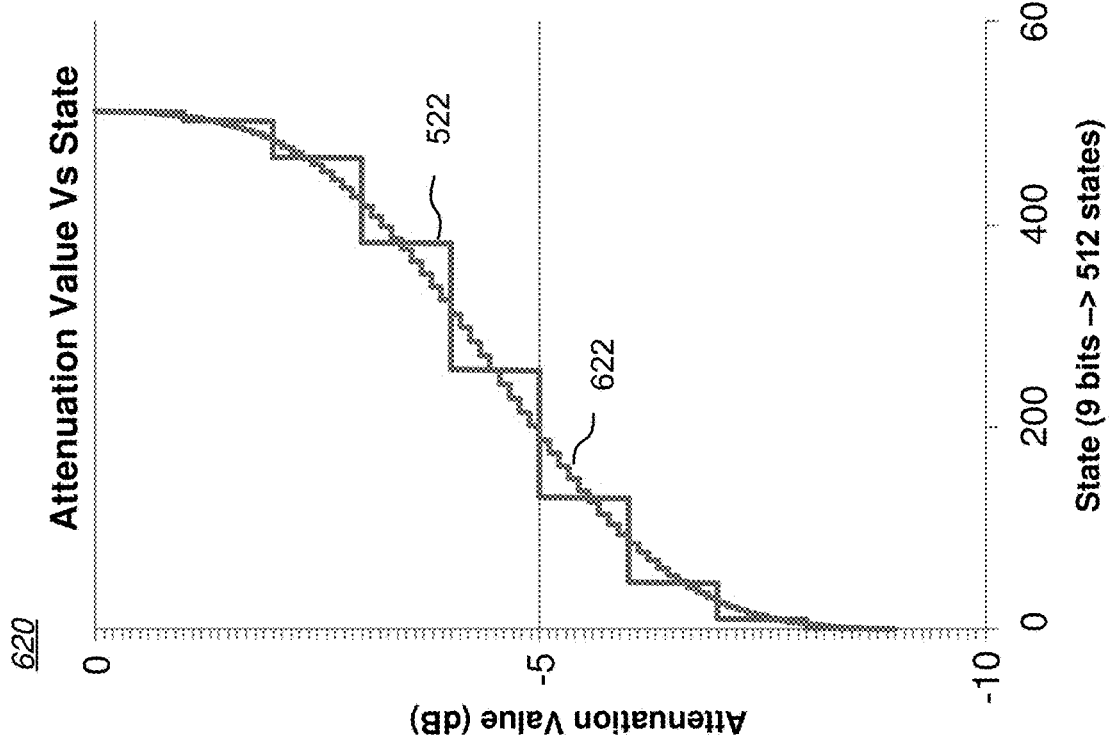
FIG. 6B is a graph showing the possible attenuation levels that can be set as a function of various combinations of bit position states for the bit position weighting shown in FIG. 6A.
Figure 6A:
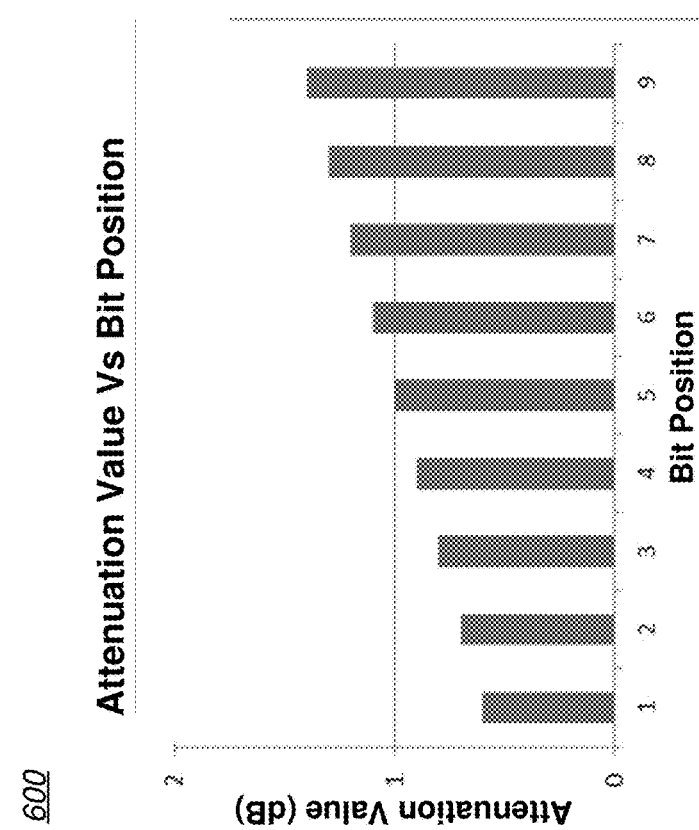
FIG. 6A is a graph of attenuation weights by bit position for a 9-bit DSA using a linear series bit position weighting.

A DSA example is again used for purposes of explanation (but the concept applies to DPS's as well). FIG. 6A is a graph 600 of attenuation weights by bit position for a 9-bit DSA using a linear series bit position weighting. As the graph 600 shows, each bit position (representing an attenuator stage) is set to an attenuation level that ranges from about 0.6 dB to about 1.5 dB. In the illustrated example, the average attenuation level per bit position is about 1 dB, but the difference in attenuation level between adjacent bit positions is about 0.11 dB. Such a bit position weighting would be particularly useful with transmission line DSA's (and transmission line DPS's) since the variance from average for all bit positions is not particularly large, and the maximum bit attenuation levels are kept within the 1-2 dB range generally suitable for shunt values on a transmission line.

In the illustrated example, combinations of bit positions can be selectively activated to provide total attenuation ranging from zero dB to about −9 dB. However, by utilizing the large number of states available (512 in this example), various combinations of bit positions can produce intermediate steps of attenuation resolution that are much finer than the prior art example of FIGS. 5A and 5B. For example, FIG. 6B is a graph 620 showing the possible attenuation levels that can be set as a function of various combinations of bit position states for the bit position weighting shown in FIG. 6A. Graph curve 522 shows the coarse step function from FIG. 5B, resulting from the 1 dB minimum resolution available between distinct attenuation levels. In contrast, graph curve 622 shows a much finer step function from the bit position weighting shown in FIG. 6A for approximately the same total range of attenuation, resulting from the finer minimum resolution available between distinct attenuation levels (about 0.11 dB).

As a specific example, if bit position 8 has a weighting of 1.5 dB, and bit position 1 has a weighting of 0.6 dB, activating both bits provides 2.1 dB of attenuation—a value not obtainable with the uniform bit position weighting shown in FIG. 5A.

Figure 6D:
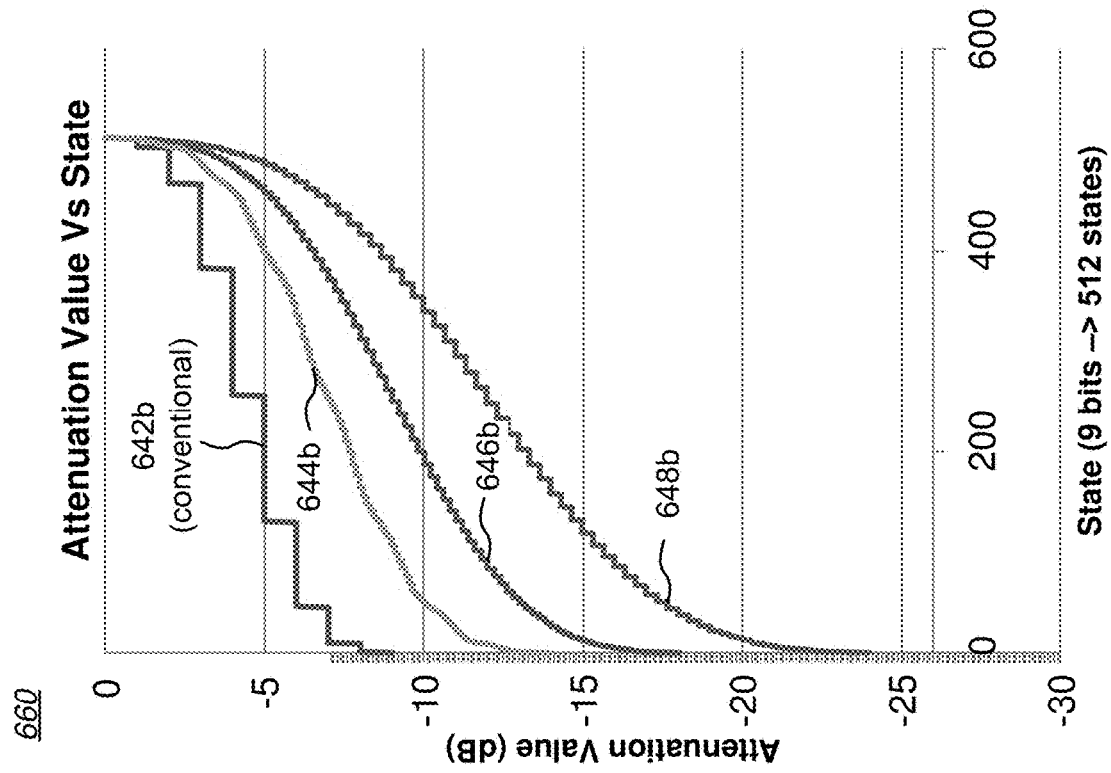
FIG. 6D is a graph showing the possible attenuation levels that can be set as a function of various combinations of bit position states for the bit position weightings shown in FIG. 6C.
Figure 6C:
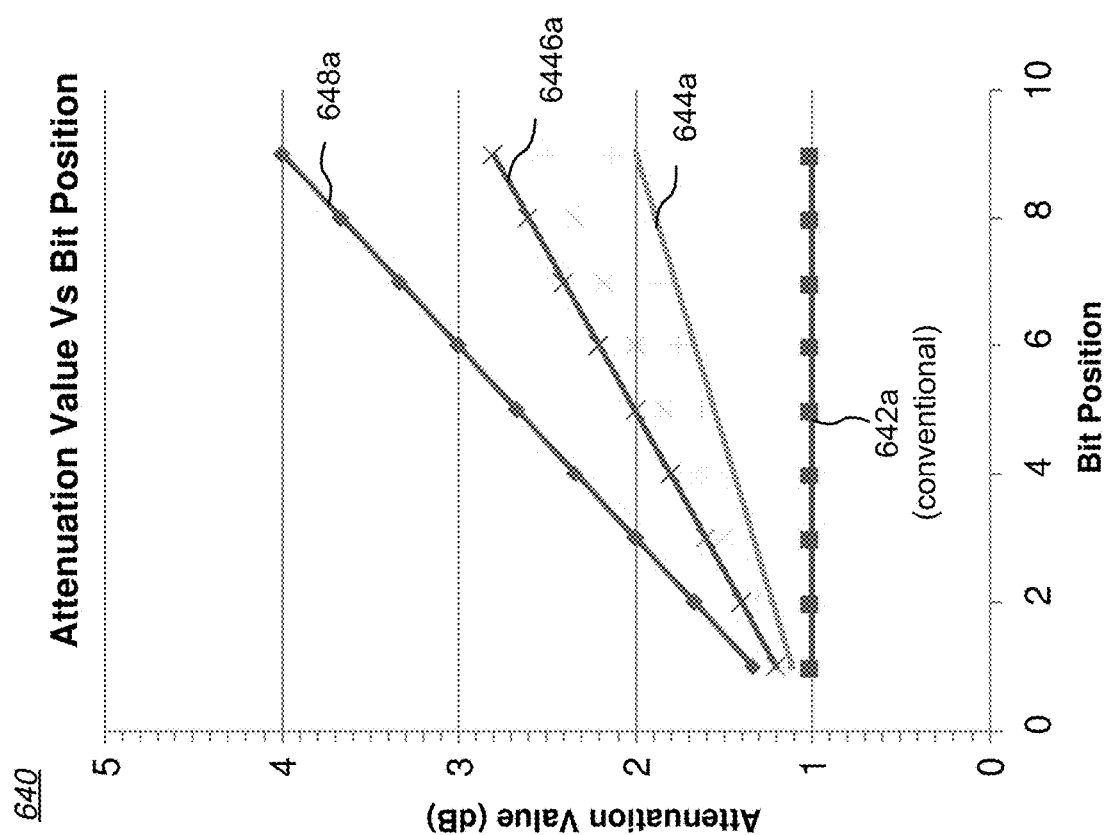
FIG. 6C is a graph of attenuation weights by bit position for a 9-bit DSA using a linear series bit position weighting, for different values of A0 and K.

As should be appreciated, both A0 and K in the mathematical expression set forth above may be varied for particular applications. For example, FIG. 6C is a graph 640 of attenuation weights by bit position for a 9-bit DSA using a linear series bit position weighting, for different values of A0 and K, and FIG. 6D is a graph 660 showing the possible attenuation levels that can be set as a function of various combinations of bit position states for the bit position weightings shown in FIG. 6C. For comparison, graph curve 642a represents the uniform bit position weighting of FIG. 5A, and graph curve 642b represents the corresponding possible attenuation levels.

Graph curve 644a represents a bit position weighting in which A0 is about 1.1 dB and K is about 0.1; graph curve 644b represents the corresponding possible attenuation levels. Graph curve 646a represents a bit position weighting in which A0 is about 1.2 dB and K is about 0.18; graph curve 644b represents the corresponding possible attenuation levels. Graph curve 648a represents a bit position weighting in which A0 is about 1.3 dB and K is about 0.3; graph curve 644b represents the corresponding possible attenuation levels. Of note, as one example, graph curves 644a and 644b indicate that, compared to graph curves 642a and 642b (taken from FIG. 5A and FIG. 5B, respectively), the maximum attenuation per bit is maintained, the range is increased, and the resolution is significantly improved. As FIG. 6D shows, larger values for K result in a larger total attenuation range, but with slightly lower resolution.

It should be appreciated that the actual assignment of bit position weightings to physical DSA or DPS stages can be ordered in a different manner without changing the result— only the mapping of states to physical stages would change. Thus, for example, the weights assigned to bit positions 1 and 2 could be reversed, and any other physical ordering of the bit position weighting values may be assigned to the stages. Accordingly, it should be understood that the graphs of non-uniform weightings shown in FIGS. 6A-6D are a convenient way of calculating the bit position weights that could be assigned to a sequentially ordered set of DSA or DPS stages, but are not a limitation that requires strict assignment of the calculated bit position weights to physically sequential stages.

Alternating linear series bit position weighting: In a second embodiment, the weights assigned to bit positions in a DSA or a DPS are determined by applying an alternating linear series bit position weighting. Expressed mathematically, the $n^{th}$ bit value=$A0+(-1)^n \times((n-1) \times K)$, where A0 is a constant, n=bit position ≥1, and K is a non-zero proportionality constant. With this expression, the first bit position will be equal to A0, and the second bit position will have a more positive value relative to A0. An alternative form provides for a more negative value for the second bit position relative to A0, and thus gives somewhat different results: $n^{th}$ bit value=$A0+(-1)^{(n-1)} \times((n-1) \times K)$.

FIG. 7A is a graph 700 of attenuation weights by bit position for a 9-bit DSA using an alternating linear series bit position weighting, for different values of A0 and K, and FIG. 7B is a graph 720 showing the possible attenuation levels that can be set as a function of various combinations of bit position states for the bit position weightings shown in FIG. 7A. For comparison, graph curve 642a represents the uniform bit position weighting of FIG. 5A, and graph curve 642b represents the corresponding possible attenuation levels.

Graph curve 702a shows that each bit position is set to an attenuation level that ranges above or below 1 dB by as much as about 0.4 dB, based on a particular selection of A0 and K; graph curve 702b represents the corresponding possible attenuation levels. Graph curve 704a shows that each bit position is set to an attenuation level that ranges above or below 1 dB by as much as about 0.9 dB, based on another particular selection of K (A0 is the same as for graph curve 702a); graph curve 704b represents the corresponding possible attenuation levels. In both cases, the resolution from the alternating linear series bit position weighting is much finer than the resolution of conventional uniform weighting. As noted above, the actual assignment of bit position weightings to physical DSA or DPS stages can be ordered in a different manner without changing the result— only the mapping of weights to stages would change.

Geometric series bit position weighting: In a third embodiment, the weights assigned to bit positions in a DSA or a DPS are determined by applying a geometric series bit position weighting. Expressed mathematically, the $n^{th}$ bit value=$A0+K/2^{(n-1)}$, where A0 is a constant, n=bit position ≥1, and K is a non-zero proportionality constant. With this expression, the first bit position will be positive relative to A0 (i.e., A0+K), and the second bit position will have a more negative value relative to the first bit position (i.e., A0+K/2). An alternative form provides for a first bit position that is negative relative to A0 (i.e., A0−K), and a more positive value for the second bit position relative to the first bit position (i.e., A0−K/2), and thus gives somewhat different results: $n^{th}$ bit value=$A0-K/2^{(n-1)}$.

FIG. 8A is a graph 800 of attenuation weights by bit position for a 9-bit DSA using a geometric series bit position weighting, for different values of A0 and K, and FIG. 8B is a graph 820 showing the possible attenuation levels that can be set as a function of various combinations of bit position states for the bit position weightings shown in FIG. 8A. For comparison, graph curve 642a represents the uniform bit position weighting of FIG. 5A, and graph curve 642b represents the corresponding possible attenuation levels.

Graph curve 802a shows that each bit position is set to an attenuation level that starts at about 1.25 dB and declines, asymptotically approaching about 1 dB, based on a particular selection of A0 and K; graph curve 802b represents the corresponding possible attenuation levels. Graph curve 804a shows that each bit position is set to an attenuation level that starts at about 1.75 dB and declines, asymptotically approaching about 1 dB, based on another particular selection of A0 and K; graph curve 804b represents the corresponding possible attenuation levels. Graph curve 806a shows that each bit position is set to an attenuation level that starts at about 3 dB and declines, asymptotically approaching about 1 dB, based on yet another particular selection of A0 and K; graph curve 862b represents the corresponding possible attenuation levels.

In all cases, the resolution from the geometric series bit position weighting is finer—and in some cases, much finer—than the resolution of conventional uniform weighting. As noted above, the actual assignment of bit position weightings to physical DSA or DPS stages can be ordered in a different manner without changing the result—only the mapping of weights to stages would change.

Alternating geometric series bit position weighting: In a fourth embodiment, the weights assigned to bit positions in a DSA or a DPS are determined by applying an alternating geometric series bit position weighting. Expressed mathematically, the $n^{th}$ bit value=$A0+(-1)^{(n-1)} \times K/2^{(n-1)}$, where A0 is a constant, n=bit position ≥1, and K is a non-zero proportionality constant. With this expression, the first bit position will be positive relative to A0, and the second bit position will have a more negative value relative to the first bit position. An alternative form provides for a first bit position that is negative relative to A0, and a more positive value for the second bit position relative to the first bit position, and thus gives somewhat different results: $n^{th}$ bit value=$A0+(-1)^{n} \times K/2^{(n-1)}$.

FIG. 9A is a graph 900 of attenuation weights by bit position for a 9-bit DSA using an alternating geometric series bit position weighting, for different values of A0 and K, and FIG. 9B is a graph 920 showing the possible attenuation levels that can be set as a function of various combinations of bit position states for the bit position weightings shown in FIG. 9A. For comparison, graph curve 642a represents the uniform bit position weighting of FIG. 5A, and graph curve 642b represents the corresponding possible attenuation levels.

Graph curve 902a shows that each bit position is set to an attenuation level that starts at about 1.25 dB and alternatives to declining values below and above 1 dB, asymptotically approaching about 1 dB, based on a particular selection of A0 and K; graph curve 902b represents the corresponding possible attenuation levels. Graph curve 904a shows that each bit position is set to an attenuation level that starts at about 1.75 dB and alternatives to declining values below and above 1 dB, asymptotically approaching about 1 dB, based on another particular selection of A0 and K; graph curve 904b represents the corresponding possible attenuation levels. Graph curve 906a shows that each bit position is set to an attenuation level that starts at about 2.75 dB and alternatives to declining values below and above 1 dB, asymptotically approaching about 1 dB, based on yet another particular selection of A0 and K; graph curve 902b represents the corresponding possible attenuation levels.

In all cases, the resolution from the alternating geometric series bit position weighting is finer—and in some cases, much finer—than the resolution of conventional uniform weighting. As noted above, the actual assignment of bit position weightings to physical DSA or DPS stages can be ordered in a different manner without changing the result—only the mapping of weights to stages would change.

Harmonic series bit position weighting: In a fifth embodiment, the weights assigned to bit positions in a DSA or a DPS are determined by applying a harmonic series bit position weighting. Expressed mathematically, the $n^{th}$ bit value=$A0+K/n$, where A0 is a constant, n=bit position ≥1, and K is a non-zero proportionality constant. With this expression, the first bit position will be positive relative to A0, and the second bit position will have a more negative value relative to the first bit position. An alternative form provides for a first bit position that is negative relative to A0, and a more positive value for the second bit position relative to the first bit position, and thus gives somewhat different results: $n^{th}$ bit value=$A0-K/n$.

FIG. 10A is a graph 1000 of attenuation weights by bit position for a 9-bit DSA using a harmonic series bit position weighting, for different values of A0 and K, and FIG. 10B is a graph 1020 showing the possible attenuation levels that can be set as a function of various combinations of bit position states for the bit position weightings shown in FIG. 10A. For comparison, graph curve 642a represents the uniform bit position weighting of FIG. 5A, and graph curve 642b represents the corresponding possible attenuation levels.

Graph curve 1002a shows that each bit position is set to an attenuation level that starts at about 1.95 dB and declines to values near 1 dB by an offset amount, based on a particular selection of A0 and K; graph curve 1002b represents the corresponding possible attenuation levels. Graph curve 1004a shows that each bit position is set to an attenuation level that starts at about 1.65 dB and declines to values near 1 dB by an offset amount, based on another particular selection of A0 and K; graph curve 1004b represents the corresponding possible attenuation levels. Graph curve 1006a shows that each bit position is set to an attenuation level that starts at about 1 dB and increases to values near about 1.65 dB by an offset amount, based on another particular selection of A0 and K; graph curve 1006b represents the corresponding possible attenuation levels. Graph curve 1008a shows that each bit position is set to an attenuation level that starts at about 0.7 dB and increases to values near about 1.6 dB by an offset amount, based on another particular selection of A0 and K; graph curve 1008b represents the corresponding possible attenuation levels. In all cases, the first bit position is positive relative to A0.

In all cases, the resolution from the harmonic series bit position weighting is finer—and in some cases, much finer—than the resolution of conventional uniform weighting. As noted above, the actual assignment of bit position weightings to physical DSA or DPS stages can be ordered in a different manner without changing the result—only the mapping of weights to stages would change.

Alternating harmonic series bit position weighting: In a sixth embodiment, the weights assigned to bit positions in a DSA or a DPS are determined by applying an alternating harmonic series bit position weighting. Expressed mathematically, the $n^{th}$ bit value=$A0+(-1)^{n} \times K/n$, where A0 is a constant, n=bit position ≥1, and K is a non-zero proportionality constant. With this expression, the first bit position will be negative relative to A0, and the second bit position will have a more positive value relative to the first bit position. An alternative form provides for a first bit position that is positive relative to A0, and a more negative value for the second bit position relative to the first bit position, and thus gives somewhat different results: $n^{th}$ bit value= $A0+(-1)^{(n-1)} \times K/n$.

FIG. 11A is a graph 1100 of attenuation weights by bit position for a 9-bit DSA using an alternating harmonic series bit position weighting, for different values of A0 and K, and FIG. 11B is a graph 1120 showing the possible attenuation levels that can be set as a function of various combinations of bit position states for the bit position weightings shown in FIG. 11A. For comparison, graph curve 642a represents the uniform bit position weighting of FIG. 5A, and graph curve 642b represents the corresponding possible attenuation levels.

Graph curve 1102a shows that each bit position is set to an attenuation level that starts at about 1.75 dB and alternates below and above 1 dB, approaching levels below and above about 1 dB by an offset amount, based on a particular selection of A0 and K; graph curve 1102b represents the corresponding possible attenuation levels. Similarly, graph curve 1104a shows that each bit position is set to an attenuation level that starts at about 1.5 dB and alternates below and above 1 dB, approaching levels below and above about 1 dB by an offset amount, based on another particular selection of A0 and K; graph curve 1104b represents the corresponding possible attenuation levels. In both cases, the first bit position is positive relative to A0.

Graph curves 1102a and 1104a start with weighting values above 1 dB. In contrast, graph curve 1106a shows that each bit position is set to an attenuation level that starts at about 0.25 dB and alternates above and below 1 dB, approaching levels above and below about 1 dB by an offset amount, based on a particular selection of A0 and K; graph curve 1106b represents the corresponding possible attenuation levels. Similarly, graph curve 1108a shows that each bit position is set to an attenuation level that starts at about 0.5 dB and alternates above and below 1 dB, approaching levels above and below about 1 dB by an offset amount, based on another particular selection of A0 and K; graph curve 1108b represents the corresponding possible attenuation levels. In both cases, the first bit position is negative relative to A0.

In all cases, the resolution from the alternating harmonic series bit position weighting is finer—and in some cases, much finer—than the resolution of conventional uniform weighting. As noted above, the actual assignment of bit position weightings to physical DSA or DPS stages can be ordered in a different manner without changing the result—only the mapping of weights to stages would change.

General mathematical series with added fixed bit(s): In a seventh embodiment, the weights assigned to bit positions in a DSA or a DPS are determined by applying a general mathematical series of one of the types described above (e.g., an alternating harmonic series bit position weighting), but constraining one or more bit positions to have relatively small fixed values (e.g., 0.1 dB and/or 0.25 dB) of "add-on" attenuation not determined by the general mathematical series.

Thus, as one example only, n bit positions may have values determined by an alternating harmonic series (e.g., one of $A0+(-1)^n \times K/n$ or $A0+(-1)^{(n-1)} \times K/n$, with A0=1 dB), and an n+1 bit position may be set to 0.25 dB (by way of example only), while optionally an n+2 bit position may be set to 0.1 dB (by way of example only). Selection of the "add-on" bit weights may depend on the application; for example, with one or more fixed "add-on" bit weights, resolution density can be made to spread out in certain areas. More generally, a DSA or a DPS may comprise a section of bit positions in which the weights are determined by applying a general mathematical series of one of the types described above, in combination with a section of bit positions having conventional bit position weights (e.g., thermometer and/or binary weightings).

FIG. 12A is a graph 1200 of attenuation weights by bit position for a 9-bit DSA using an alternating harmonic series bit position weighting for bit positions 1 through 8 for selected values of A0 and K, with bit position 9 being assigned a fixed value (0.25 dB in this example). FIG. 12B is a graph 1220 showing the possible attenuation levels that can be set as a function of various combinations of bit position states for the bit position weightings shown in FIG. 12A. For comparison, graph curve 642a represents the uniform bit position weighting of FIG. 5A, and graph curve 642b represents the corresponding possible attenuation levels.

Graph curve 1202a shows that each bit position is set to an attenuation level that starts at about 0.5 dB and alternatives to declining values above and below 1 dB, approaching levels above and below about 1 dB by an offset amount (about 0.15 dB in this example), based on a particular selection of A0 and K; graph curve 1202b represents the corresponding possible attenuation levels. In the illustrated embodiment, graph curve 1202a is shown extrapolated to the ninth bit position. However, because bit position 9 is instead assigned a fixed value, the actual "tail" of the graph curve 1202a will look like graph curve 1204a—essentially a hybrid of graph curve 1202a with an extended "tail" down to about 0.25 dB. Graph curve 1204b represents the corresponding possible attenuation levels for graph curve 1204a. In general, setting one or more bit positions to a small fixed value results in shifting the graph curve 1202b upwards; a downwards shift is also possible by selecting suitable values for A0, K, and the fixed value.

As should be clear, one or more added fixed value bit positions can be used with the other series-based bit position weightings described above. In all cases, the resolution of such a hybrid bit position weighting is finer—and in some cases, much finer—than the resolution of conventional uniform weighting. As noted above, the actual assignment of bit position weightings to physical DSA or DPS stages can be ordered in a different manner without changing the result—only the mapping of weights to stages would change.

Figures of Merit for Bit Position Weighting

Selection of a particular bit position weighting from those disclosed above in conjunction with embodiments of the invention will depend upon a particular application. However, it may be useful to assign a Figure of Merit (FOM) to candidate bit position weightings to assist selection. For example, one FOM can be defined as total range (of attenuation or phase shift, as the case may be) divided by the resolution (i.e., maximum step size) of a particular bit position weighting: FOM=Range/Resolution. Applying that definition to the attenuation value versus state graph curves in the examples set forth above (selecting the best FOM for examples with several graph curves) gives the values set forth in TABLE 2 below. In general, for a fixed Range, a lower maximum step size (i.e., lower Resolution) will result in a higher FOM, and therefore a higher FOM is better.

TABLE 2

| FIG. | TYPE | FOM |
|------|------|-----|
| 5B | Uniform [conventional] | ~9 |
| 6B | Linear series | ~85 |
| 7B | Alternating linear series | ~74 |
| 8B | Geometric series | ~97 |
| 9B | Alternating geometric series | ~184 |
| 10B | Harmonic series | ~72 |
| 11B | Alternating harmonic series | ~208 |
| 12B | Alternating harmonic series + minor fixed bit | ~107 |

As TABLE 2 indicates, bit position weights derived from an alternating harmonic series provides an exceptionally high FOM (~208), especially compared to the FOM (~9) of a conventional uniformly weighted design, owing to the very coarse maximum step-size of uniform bit position weighting compared to the very fine step-size achievable with an alternating harmonic series embodiment of the present invention.

Looking at embodiments of the invention in a different way, in its simplest form, one can think of "Range" for a DSA or a DPS as being dominated by the average bit weight A0 multiplied by the number of bits N (basically, a thermometer-coded string of bits each having an A0 value). The "Resolution" is then overlaid on top of this set of bits mathematically, such as by application of the mathematical series described above. The FOM definition above considers only Range and Resolution (i.e., maximum step size). An alternative FOM definition that may be used is: (Range/Resolution)*(LSB/MSB). This metric may be identically expressed as:

$$\text{(Range*LSB)/(Resolution*MSB)} \quad [\text{Eq. 3}]$$

This second FOM2 metric will clearly show the benefit of the inventive architecture compared to even a pure binary weighted architecture (best resolution possible for a conventional implementation). For example, TABLE 3 compares a conventional binary weighted embodiment against two different embodiments of the invention, which are based on alternating harmonic series bit position weightings using the equations and the values for A0 and K set forth in TABLE 4. All cases in TABLE 3 use 9 bits (i.e., N=9) and target a total attenuation range of 9 dB; higher values of the FOM2 metric are better.

TABLE 3

| Weighting | Attenuation Range (dB) | Resolution (dB) | MSB/LSB (dB/dB) | FOM2 (Eq. 3) |
|-----------|------------------------|-----------------|-----------------|--------------|
| Pure Binary (for comparison) | 9 | 0.018 | 256.0 | 2.00 |
| Alternating Harmonic Series 1 | 9 | 0.07 | 2.1 | 62.46 |
| Alternating Harmonic Series 2 | 9 | 0.06 | 2.4 | 62.89 |

TABLE 4

| Weighting | A0 | K | Equation |
|-----------|----|----|----------|
| Alternating Harmonic Series 1 | 0.959 | 0.5 | $A0 + (-1)^{(n-1)} \times K/n$ |
| Alternating Harmonic Series 2 | 1.041 | 0.5 | $A0 + (-1)^{n} \times K/n$ |

The alternating nature of the bit offset in the alternating harmonic series implementations brings increased FOM2 results by reducing the MSB-to-LSB ration significantly.

The primary reason for this improvement is that the bit-to-bit relative attenuation steps are always centered around the A0 value. The reduction in the MSB-to-LSB ratio brings benefit through increased manufacturing yields, where the range of individual circuit elements used to create the per bit attenuation or phase shift, whether resistances or impedances, will be in a more tightly constrained range, and therefore uniformity between elements more easily maintained.

The examples in TABLE 3 and TABLE 4 help illustrate some of the advantages of using an alternating series (particularly an alternating harmonic series) versus a non-alternating series. In general, the value of A0 in the mathematical expressions set forth above for embodiments of the present invention can be considered to be an offset, while the second term in each mathematical expression can be considered to be a weighting factor that is a function of n: Aw(n). Thus, for example, the weighting factor Aw(n) for an alternating harmonic series may be one of $(-1)^{n} \times K/n$ or $(-1)^{(n-1)} \times K/n$. The alternating forms of the series bit position weightings above include a factor of $(-1)^{n}$ or $(-1)^{(n-1)}$ as part of the weighting factor Aw(n), which changes the sign of the weighting factor Aw(n) for each increment of n. Alternating the sign of the weighting factor Aw(n) about the offset A0, especially for the two or three most significant bits, maximizes the range of the individual bit attenuation levels while maintaining a comparable bit position weighting.

Figure 13:
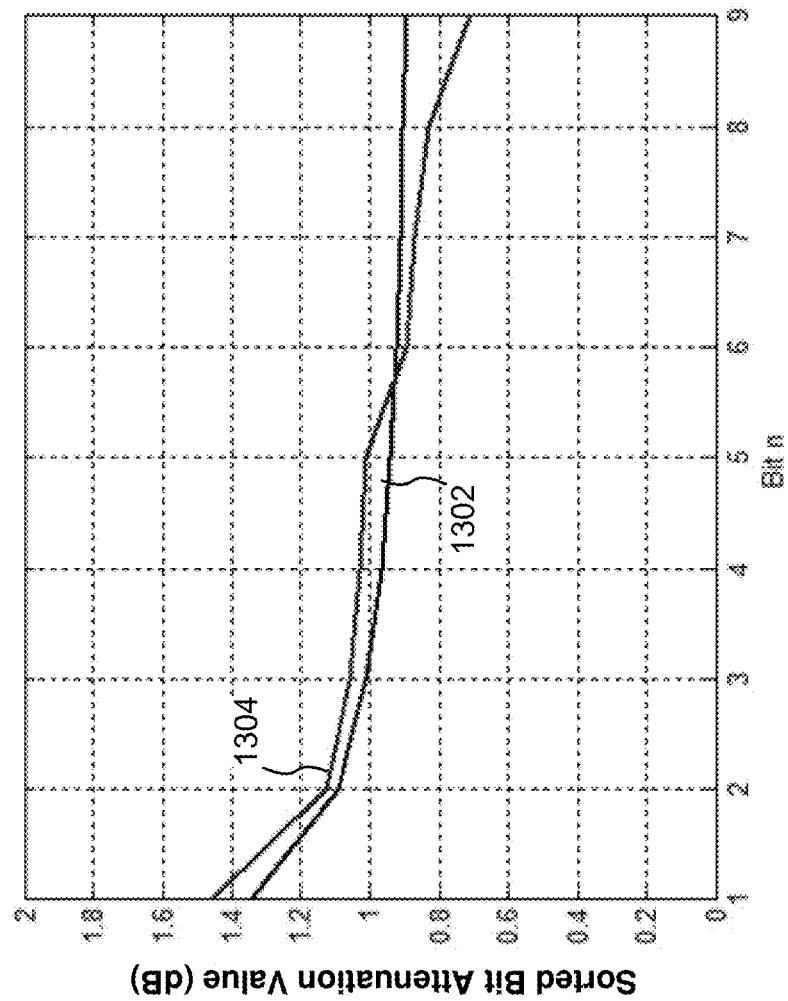
FIG. 13 is a graph of sorted attenuation weights by bit position for a 9-bit DSA using a harmonic series bit position weighting and an alternating harmonic series bit position weighting.

For example, FIG. 13 is a graph 1300 of sorted attenuation weights from largest to smallest attenuation for a 9-bit DSA using a harmonic series bit position weighting 1302 and an alternating harmonic series bit position weighting 1304 (sorting the bit position weights for the alternating harmonic series makes it easier to compare those weights to the harmonic series bit position weights). As the graph curves 1302, 1304 indicate, the range in bit level attenuation for the harmonic series bit position weighting 1302 is about 0.44 dB, while the range in bit level attenuation for the alternating harmonic series bit position weighting 1304 is about 0.75 dB. The difference is a result of the alternation of the sign of the weighting factor Aw(n) about the offset A0 as a function of n.

In general, use of a bit position weighting series that includes an alternating weighting factor Aw(n) provides more optimum resolution when either or both of the following constraints are encountered: (1) the maximum bit position attenuation level is constrained (an "MSB" constraint), and/or (2) the minimum bit position attenuation is constrained (an "LSB" constraint). In particular, using an alternating geometric series or an alternating harmonic series bit position weighting provides very fine resolution in the center of an attenuation ranges, since nearly every state provides a unique attenuation value. The attenuation offset A0 gives an added degree of freedom in applying the weighting factor Aw(n) such that relative bit attenuation levels about A0 can be made both smaller and larger than a traditional weighting when one or both of the above MSB and LSB constraints exist. That is, with a nominal attenuation offset A0, both sides of the offset can be utilized to realize larger relative attenuation levels.

Generalized Embodiment

It should be appreciated that while specific mathematical expressions have been disclosed that produce bit position weightings that provide fractional intermediate steps of attenuation or phase shift that have a resolution finer than the signal alteration value of a lowest-valued stage, other mathematical functions may provide alternative bit position weightings that also exhibit fractional intermediate steps of attenuation or phase shift that have a resolution finer than the signal alteration value of a lowest-valued stage. Further, the term "function" as used herein encompasses weighting methods that may not technically be a "function" in purely mathematic terms, but which similarly generate bit position weights that exhibit fractional intermediate steps of attenuation or phase shift and which have a resolution finer than the signal alteration value of a lowest-valued stage.

Most generally, embodiments of the invention comprise electronic circuits that include multiple stages, each stage configured to selectively alter the attenuation or phase of an applied signal, each stage being assigned a bit position and being digitally selectable by an associated control line to be in a reference state or in an active signal alteration state, wherein each stage is configured to provide an associated value of signal alteration (i.e., attenuation or phase shift, as the case may be), and wherein the associated value of signal alteration for each stage is a function of a corresponding bit position weight determined by applying a bit position weighting function that produces fractional intermediate steps of signal alteration. The fractional intermediate steps of signal alteration have a resolution finer than the signal alteration value of a lowest-valued stage. The bit position weighting function may be one of linear series function, an alternating linear series function, a geometric series function, an alternating geometric series function, a harmonic series function, or alternating harmonic series function. Further, the signal alteration value of at least one stage may be set to a fixed value that is not determined by the bit position weighting function.

Applications

Embodiments of the invention may be used in a wide variety of applications, such as DSA's and DPS's used in transceivers for broadcast radio, cellular telephones, and RF based digital networks (e.g., WiFi, Bluetooth), and in in-phase discriminators, beam forming networks, power dividers, linearization of power amplifiers, and phased array antennas, to name a few. In some applications, one or more DSA's and one or more DPS's may be coupled in parallel or serially in order to alter the attenuation and/or phase of applied input signals. As noted above, the dithering approaches described above may be used in conjunction with DSA and DPS circuits similar to the type shown in FIGS. 1, 2C, 3, and/or 4C, but with the novel bit weightings described above.

It should be noted that two or more different types of the bit position weightings described above for embodiments of the invention may be combined. For example, in a 12-bit DSA, linear bit position weighting may be used for the first 8 LSBs of the DSA, while a geometric series or harmonic series bit position weighting may be used for the 4 MSBs of the DSA.

For use with transmission line DSA's, it is particularly useful to select a bit position weighting that keeps the shunt resistance greater than about $2 \cdot Z_0$ (where $Z_0$ is the characteristic impedance of the transmission line) and the attenuation per bit to less than about two dB.

The particular values for the components of each stage of a DSA or DPS may be determined from the relative bit position weightings indicated by the expressions set forth above for the embodiments of the invention. For example, if A0 is set to 1 dB, K is set to 0.1 dB, and linear bit position weighting is used, then the first stage of a DSA may be configured to provide 1 dB of attenuation, the second stage may be configured to provide 1.1 dB of attenuation, the third stage may be configured to provide 1.2 dB of attenuation, etc., for as many stages as may be required for a particular application. Once a particular weight (i.e., a value) is selected for an attenuator or phase shifter stage, choosing components and component values to achieve that weight is a matter of conventional design.

Methods

Figure 14:
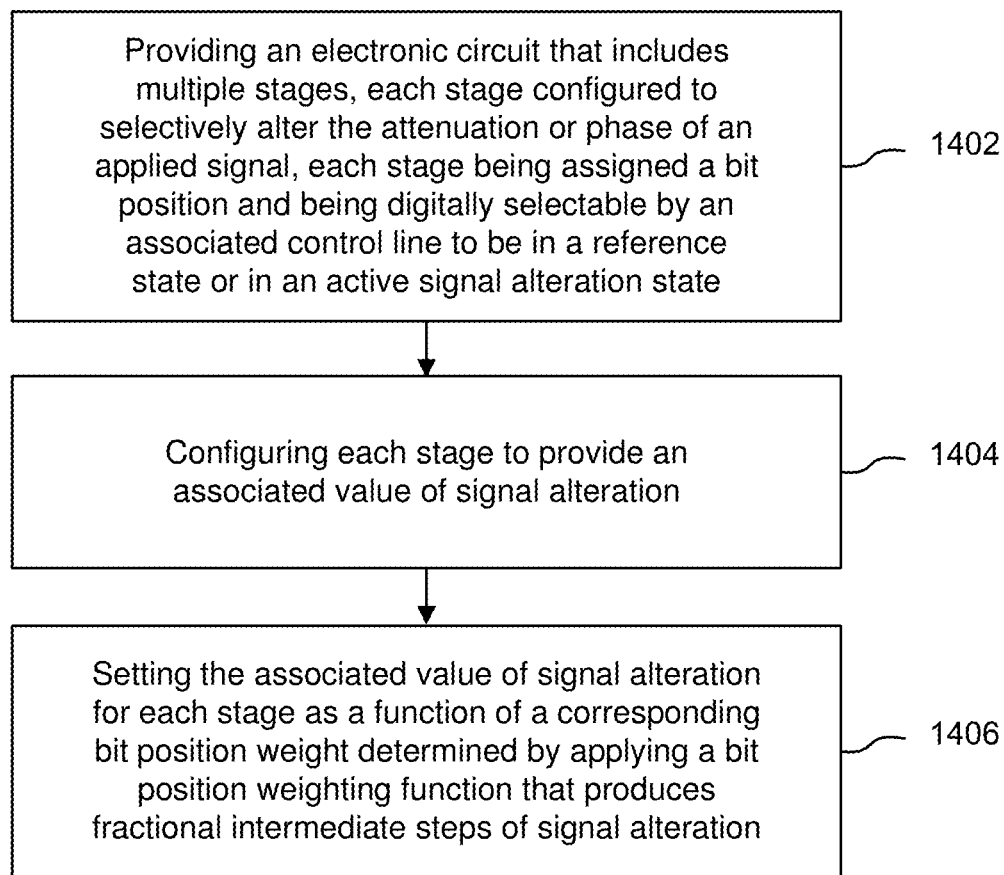
FIG. 14 is a process flow chart for a first method for setting bit position weights for multiple signal alteration stages.

Another aspect of the invention includes methods for setting bit position weights for multiple stages of a DSA or DSP. For example, FIG. 14 is a process flow chart 1400 for a first method for setting bit position weights for multiple signal alteration stages. The method includes providing an electronic circuit that includes multiple stages, each stage configured to selectively alter the attenuation or phase of an applied signal, each stage being assigned a bit position and being digitally selectable by an associated control line to be in a reference state or in an active signal alteration state (STEP 1402); configuring each stage to provide an associated value of signal alteration (STEP 1404); and setting the associated value of signal alteration for each stage as a function of a corresponding bit position weight determined by applying a bit position weighting function that produces fractional intermediate steps of signal alteration (STEP 1406).

Other aspects of the above method include: the fractional intermediate steps of signal alteration having a resolution finer than the signal alteration value of a lowest-valued stage; the bit position weighting function being one of a linear series function, an alternating linear series function, a geometric series function, an alternating geometric series function, a harmonic series function, or an alternating harmonic series function; and further including providing at least one stage having a signal alteration value set to a fixed value not determined by the bit position weighting function.

Another method for setting bit position weights includes: providing an electronic digital step attenuator circuit that includes multiple series-connected attenuator stages, each stage being assigned a bit position and being digitally selectable by an associated control line to be in a reference state or in an attenuation state; configuring each stage with components to provide an associated value of signal attenuation; and setting the associated value of signal attenuation for each stage as a function of a corresponding bit position weight determined by applying an alternating harmonic series bit position weighting function. Another aspect of this method includes providing at least one stage having a signal attenuation value set to a fixed value not determined by the alternating harmonic series bit position weighting function.

Yet another method for setting bit position weights includes: providing an electronic transmission line digital step attenuator circuit that includes multiple shunt attenuator stages, each stage being assigned a bit position and being digitally selectable by an associated control line to be in a reference state or in an attenuation state; configuring each stage with components to provide an associated value of signal attenuation; and setting the associated value of signal attenuation for each stage as a function of a corresponding bit position weight determined by applying an alternating harmonic series bit position weighting function.

Still another method for setting bit position weights includes: providing an electronic transmission line digital phase shifter circuit that includes multiple shunt phase shifter stages, each stage being assigned a bit position and being digitally selectable by an associated control line to be in a reference state or in a phase shift state; configuring each stage with components to provide an associated value of signal phase shift; and setting the associated value of signal phase shift for each stage as a function of a corresponding bit position weight determined by applying an alternating harmonic series bit position weighting function.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with DSA's and DPS's made using an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An electronic circuit, including:
   (a) a transmission line coupled to multiple shunt signal-alteration stages, each signal-alteration stage being assigned a bit position and being digitally selectable by an associated control line to be in a reference state or in a signal-alteration state;
   (b) wherein each signal-alteration stage is configured with components to provide an associated value of signal alteration; and
   (c) wherein the associated value of signal alteration for a plurality of the signal-alteration stages is a function of a corresponding bit position weight determined by applying a bit position weighting function that produces intermediate steps of signal alteration having a resolution finer than the signal alteration value of a lowest-valued signal-alteration stage.

2. The invention of claim 1, wherein the bit position weighting function is one of a linear series function or an alternating linear series function.

3. The invention of claim 1, wherein the bit position weighting function is one of a geometric series function or an alternating geometric series function.

4. The invention of claim 1, wherein the bit position weighting function is one of a harmonic series function or an alternating harmonic series function.

5. The invention of claim 1, wherein the associated value of signal alteration for at least one stage is a fixed signal alteration value.

6. The invention of claim 1, further including at least one signal-alteration stage having a signal alteration value set to a value not determined by the bit position weighting function.

7. The invention of claim 1, wherein at least one of the at least one signal-alteration stage attenuates a signal applied to the transmission line.

8. The invention of claim 1, wherein at least one of the at least one signal-alteration stage alters a phase of a signal applied to the transmission line.

9. An electronic transmission line digital step attenuator circuit, including:
   (a) a transmission line coupled to multiple shunt attenuator stages, each stage including a resistance and being assigned a bit position and being digitally selectable by an associated control line to be in a reference state or in an attenuation state;
   (b) wherein each stage is configured with components to provide an associated value of signal attenuation; and
   (c) wherein the associated value of signal attenuation for a plurality of the stages is a function of a corresponding bit position weight determined by applying a bit position weighting function that produces intermediate steps of signal attenuation having a resolution finer than the signal attenuation value of a lowest-valued attenuator stage.

10. The invention of claim 9, wherein the bit position weighting function is one of a linear series function or an alternating linear series function.

11. The invention of claim 9, wherein the bit position weighting function is one of a geometric series function or an alternating geometric series function.

12. The invention of claim 9, wherein the bit position weighting function is one of a harmonic series function or an alternating harmonic series function.

13. The invention of claim 9, wherein the associated value of signal attenuation for at least one stage is a fixed signal attenuation value.

14. The invention of claim 9, further including at least one attenuation stage having a signal attenuation value set to a value not determined by the bit position weighting function.

15. An electronic transmission line digital phase shifter circuit, including:
  (a) a transmission line coupled to multiple shunt phase shifter stages, each stage including a reactance and being assigned a bit position and being digitally selectable by an associated control line to be in a reference state or in a phase shift state;
  (b) wherein each stage is configured with components to provide an associated value of signal phase shift; and
  (c) wherein the associated value of signal phase shift for a plurality of the stages is a function of a corresponding bit position weight determined by applying a bit position weighting function.

16. The invention of claim 15, wherein the bit position weighting function is one of a linear series function or an alternating linear series function.

17. The invention of claim 15, wherein the bit position weighting function is one of a geometric series function or an alternating geometric series function.

18. The invention of claim 15, wherein the bit position weighting function is one of a harmonic series function or an alternating harmonic series function.

19. The invention of claim 15, wherein the associated value of signal phase shift for at least one stage is a fixed signal phase shift value.

20. The invention of claim 15, further including at least one phase shifter stage having a signal phase shift value set to a value not determined by the bit position weighting function.

* * * * *